(12) United States Patent
Scarbrough et al.

(10) Patent No.: US 11,094,595 B2
(45) Date of Patent: Aug. 17, 2021

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Alyssa N. Scarbrough, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 16/728,962

(22) Filed: Dec. 27, 2019

(65) Prior Publication Data

US 2021/0202324 A1 Jul. 1, 2021

(51) Int. Cl.
*H01L 21/8234* (2006.01)
*H01L 27/11582* (2017.01)
*H01L 27/11556* (2017.01)

(52) U.S. Cl.
CPC ........... *H01L 21/823487* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 8,492,278 B2 | 7/2013 | Good et al. | |
| 8,735,216 B2 | 5/2014 | Liu et al. | |
| 8,980,752 B2 | 3/2015 | Good et al. | |
| 9,786,673 B1 | 10/2017 | Cho et al. | |
| 9,893,083 B1 | 2/2018 | Wang et al. | |
| 10,014,309 B2 | 7/2018 | Dorhout et al. | |
| 10,381,377 B2 | 8/2019 | Wang et al. | |
| 10,388,665 B1 | 8/2019 | Xie et al. | |
| 10,553,607 B1 * | 2/2020 | Howder | H01L 29/40111 |
| 2008/0014761 A1 | 1/2008 | Bhatia et al. | |
| 2011/0298013 A1 | 12/2011 | Hwang et al. | |
| 2012/0052672 A1 | 3/2012 | Nakanishi et al. | |
| 2012/0098050 A1 | 4/2012 | Shim et al. | |

(Continued)

OTHER PUBLICATIONS

U.S. Appl. No. 16/793,581, filed Jan. 10, 2020, by Tiwari.

(Continued)

*Primary Examiner* — Hsien Ming Lee
(74) *Attorney, Agent, or Firm* — Wells St. John P.S.

(57) ABSTRACT

A method used in forming a memory array comprising strings of memory cells comprises forming a stack comprising vertically-alternating first tiers and second tiers. The stack comprises laterally-spaced memory-block regions that have horizontally-elongated trenches there-between. Sacrificial material is formed in the trenches. Vertical recesses are formed in the sacrificial material. The vertical recesses extend across the trenches laterally-between and are longitudinally-spaced-along immediately-laterally-adjacent of the memory-block regions. Bridge material is formed in the vertical recesses to line and less-than-fill the vertical recesses and form bridges there-from that have an upwardly-open cup-like shape. The sacrificial material in the trenches is replaced with intervening material that is directly under the bridges. Additional methods and structures independent of methods are disclosed.

33 Claims, 31 Drawing Sheets

(56) References Cited

U.S. PATENT DOCUMENTS

| | | |
|---|---|---|
| 2013/0009236 A1 | 1/2013 | Lee et al. |
| 2013/0140623 A1 | 6/2013 | Lee et al. |
| 2015/0206900 A1 | 7/2015 | Nam et al. |
| 2015/0318301 A1 | 11/2015 | Lee et al. |
| 2015/0340377 A1 | 11/2015 | Lee |
| 2016/0204117 A1 | 7/2016 | Liu et al. |
| 2016/0268302 A1 | 9/2016 | Lee et al. |
| 2016/0343726 A1 | 11/2016 | Yune |
| 2017/0148805 A1 | 5/2017 | Nishikawa et al. |
| 2017/0278859 A1 | 9/2017 | Sharangpani et al. |
| 2018/0047739 A1 | 2/2018 | Dorhout et al. |
| 2018/0130814 A1 | 5/2018 | Lee |
| 2018/0261615 A1 | 9/2018 | Minemura |
| 2018/0294273 A1 | 10/2018 | Liao et al. |
| 2018/0342528 A1 | 11/2018 | Lee |
| 2019/0019724 A1 | 1/2019 | Cheng et al. |
| 2019/0067182 A1 | 2/2019 | Lee |
| 2019/0088671 A1 | 3/2019 | Greenlee et al. |
| 2019/0237476 A1 | 8/2019 | Lee et al. |
| 2019/0312054 A1 | 10/2019 | Yun et al. |
| 2019/0363100 A1 | 11/2019 | Lee et al. |
| 2020/0098781 A1 | 3/2020 | Xiao |
| 2020/0127005 A1 | 4/2020 | Otsu et al. |
| 2020/0194373 A1 | 6/2020 | Baek et al. |
| 2020/0295031 A1 | 9/2020 | Lue |
| 2020/0312863 A1 | 10/2020 | Iwai et al. |
| 2020/0388629 A1 | 12/2020 | Lee et al. |
| 2021/0043647 A1 | 2/2021 | Kim et al. |

OTHER PUBLICATIONS

Jang et al., "Vertical Cell Array using TCAT (Terabit Cell Array Transistor) Technology for Ultra High Density NAND Flash Memory", IEEE, Symposium on VLSI Technology Digest of Technical Papers, United States, 2009, pp. 192-193.
U.S. Appl. No. 16/545,375, filed Aug. 20, 2019, by Zhang et al.
U.S. Appl. No. 16/550,238, filed Aug. 25, 2019, by Hu et al.
U.S. Appl. No. 16/550,244, filed Aug. 25, 2019, by Tessariol et al.
U.S. Appl. No. 16/550,250, filed Aug. 25, 2019, by Greenlee et al.
U.S. Appl. No. 16/550,252, filed Aug. 25, 2019, by Xu et al.
U.S. Appl. No. 16/599,856, filed Oct. 11, 2019, by Billingsley et al.
U.S. Appl. No. 16/657,498, filed Oct. 18, 2019, by King et al.
U.S. Appl. No. 16/663,683, filed Oct. 25, 2019, by Machkaoutsan et al.
U.S. Appl. No. 16/664,618, filed Oct. 25, 2019, by Hu et al.

* cited by examiner

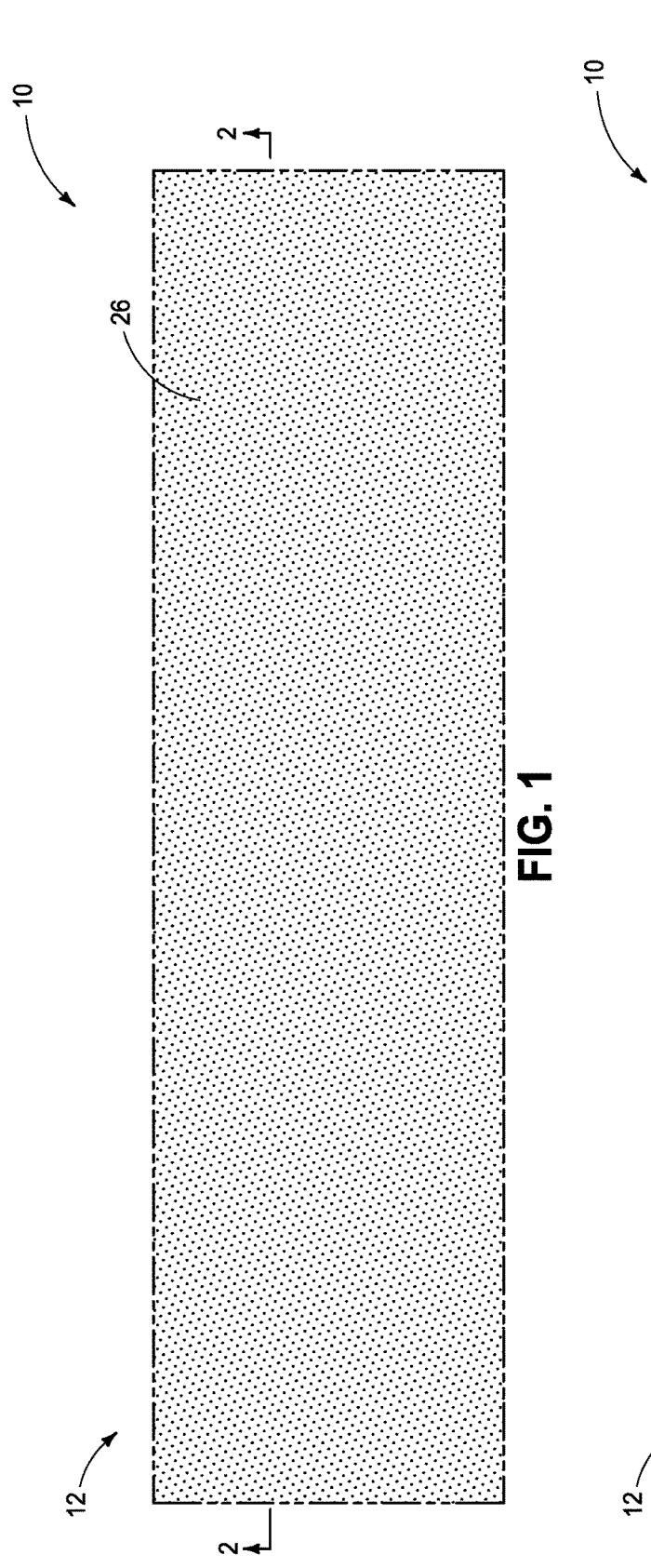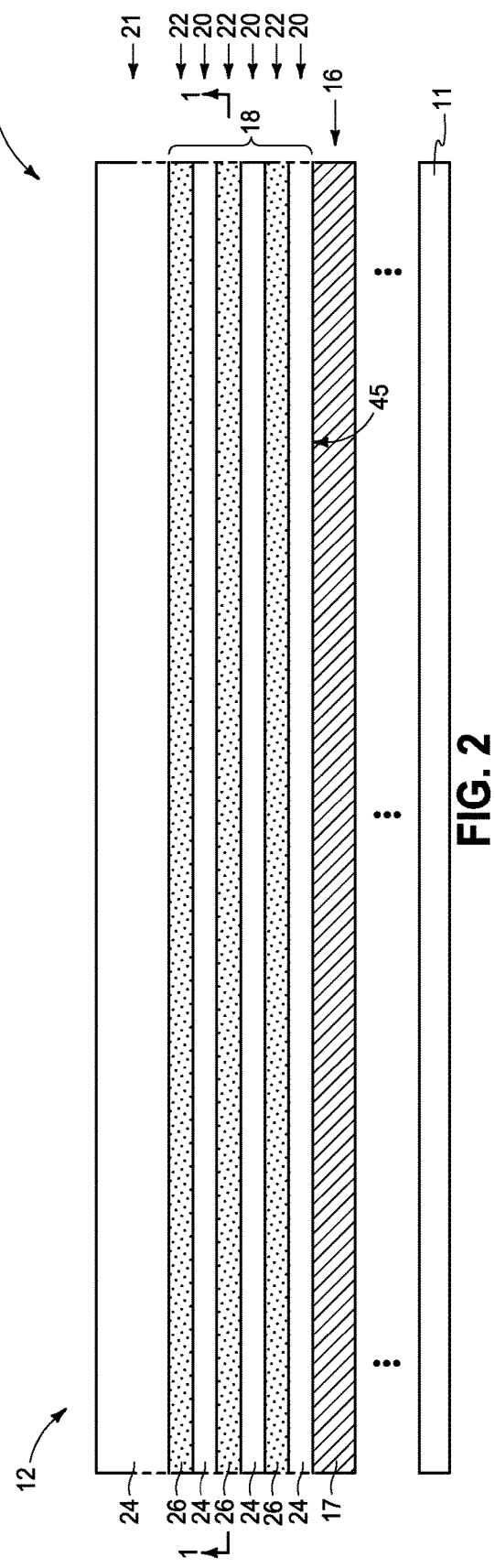

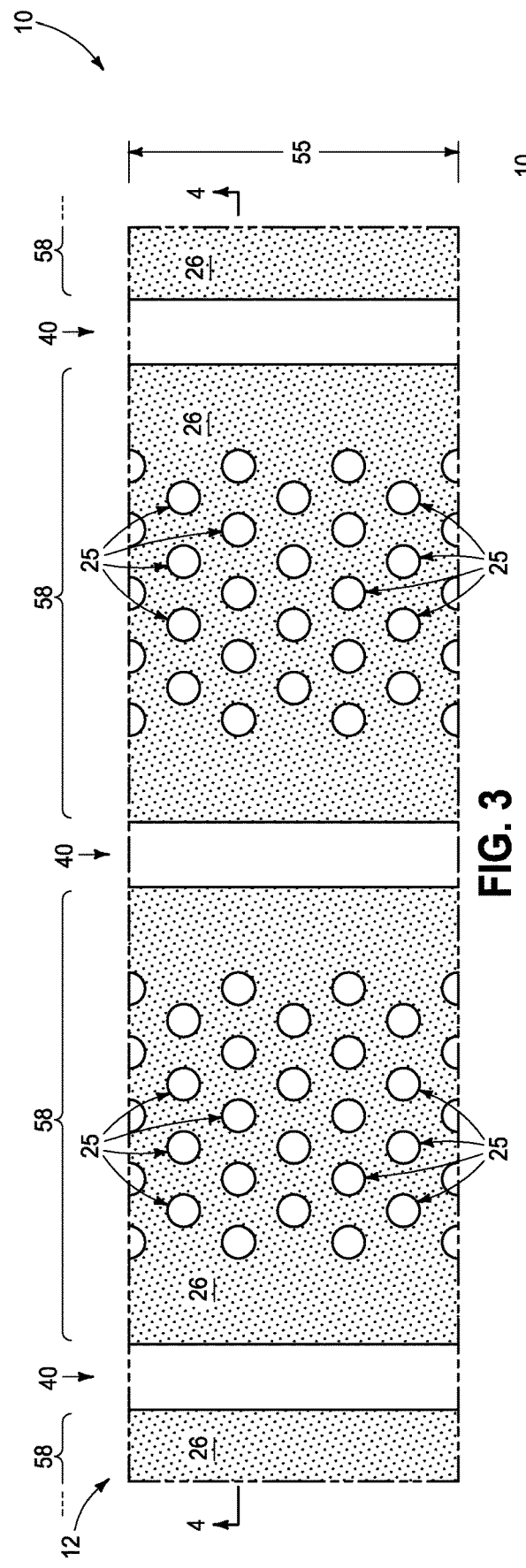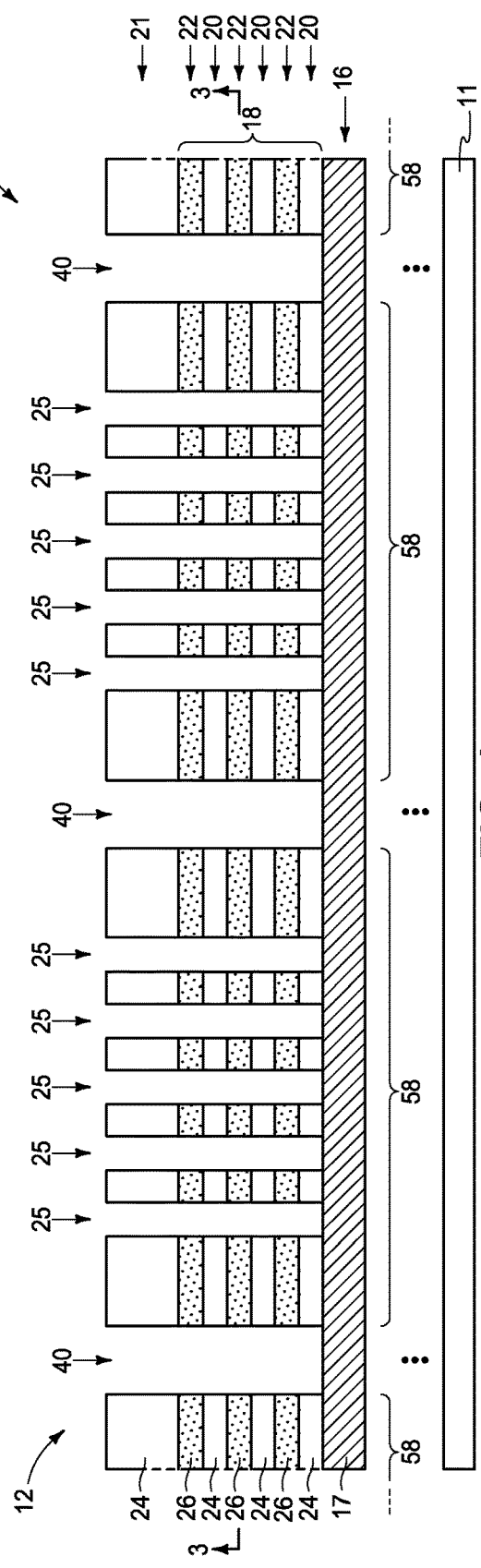

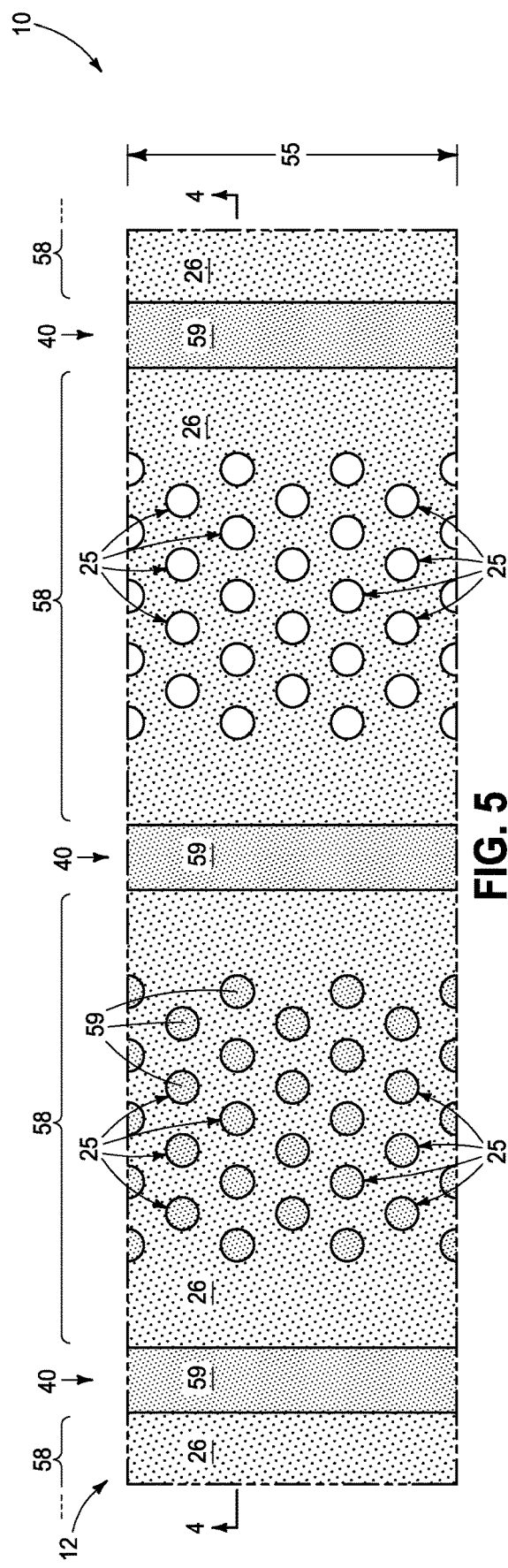
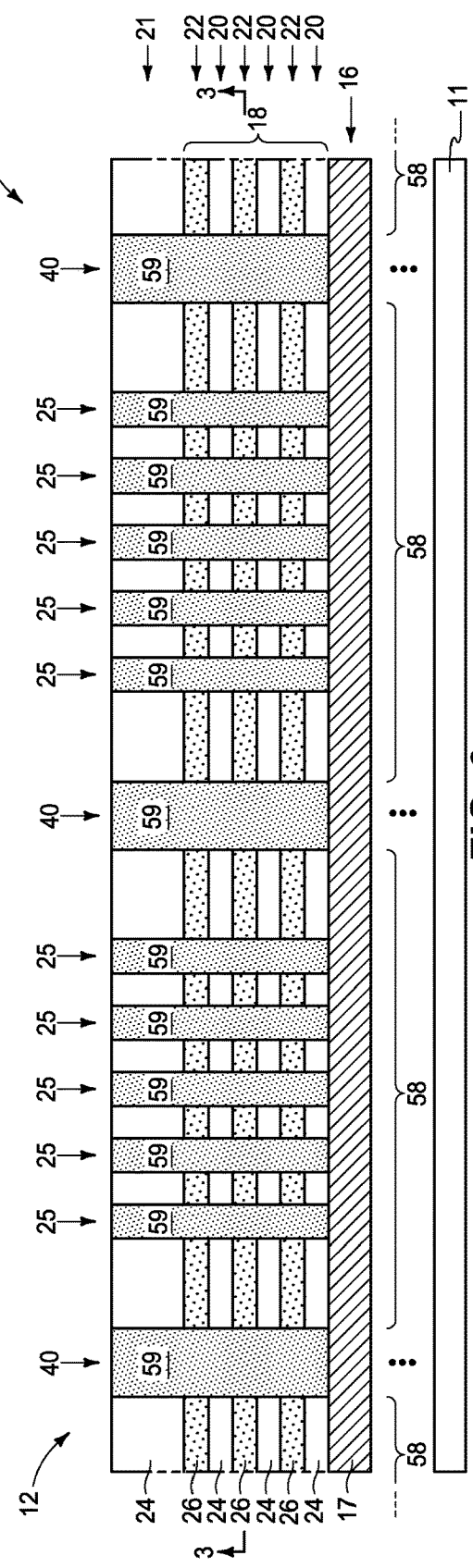
FIG. 5
FIG. 6

MEMORY ARRAYS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3-36 are diagrammatic sequential sectional, expanded, enlarged, and/or partial views of the construction of FIGS. 1 and 2, or portions thereof, in process in accordance with some embodiments of the invention.

DETAILED DESCRIPTION OF EXAMPLE EMBODIMENTS

Figure 7:
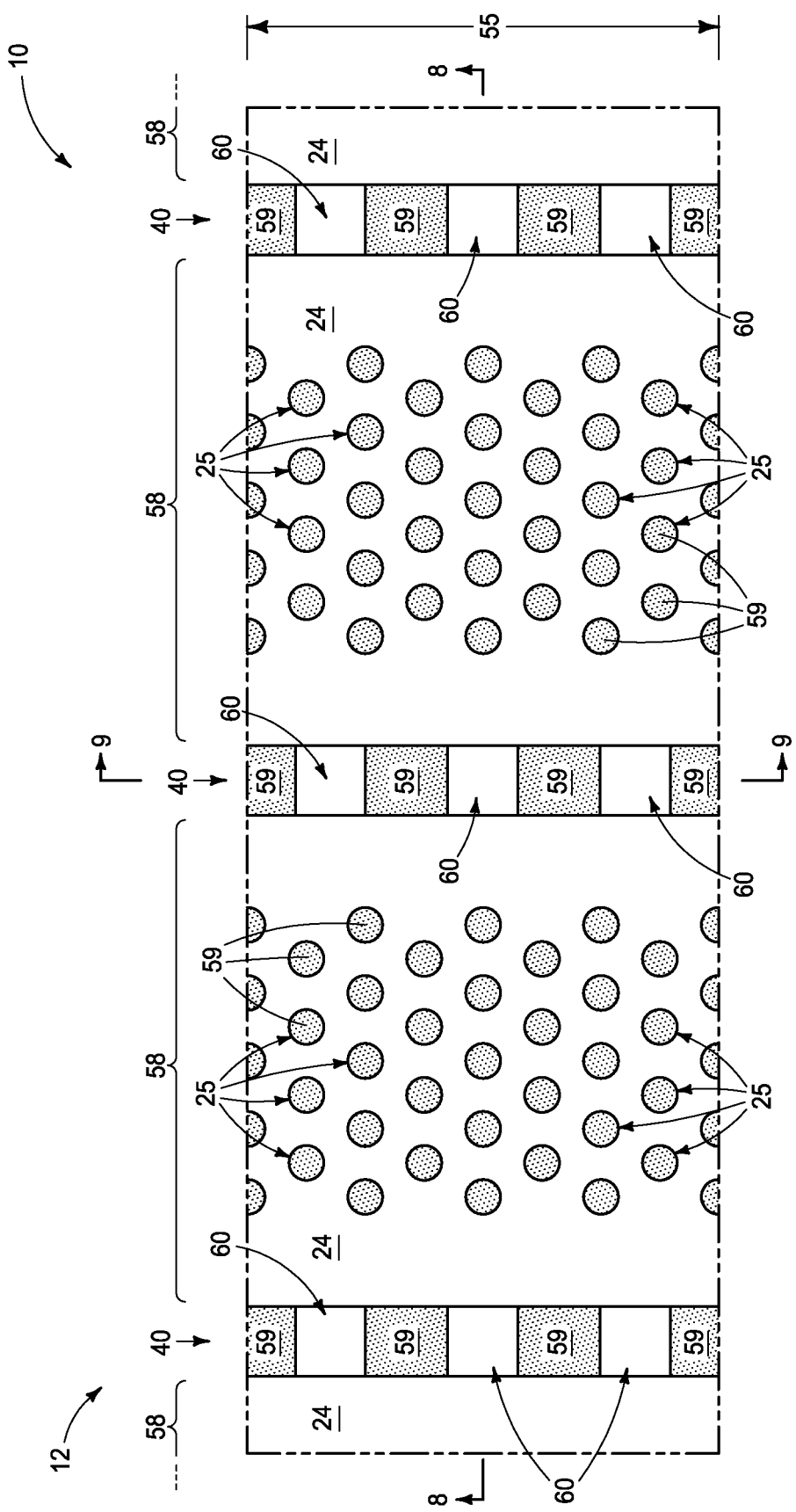

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array comprising strings of memory cells, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-36 which may be considered as a "gate-last" or "replacement-gate" process.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Stack 18 may be considered in some embodiments as comprising a bottom 45.

In some embodiments, stack 18 may be a lower stack 18 and an upper stack (not shown) is formed subsequently as described below. In such embodiments, first tiers 22 may be considered as lower first tiers 22 and second tiers 20 may be considered as lower second tiers 22. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22. Further, one or more select gate tiers (not shown) may be above an uppermost of conductive tiers 22 (e.g., and/or above an uppermost conductive tier in an upper stack and not shown). Alternately or additionally, at least one of the depicted uppermost and lowest conductive tiers 22 may be a select gate tier. Example first tiers 22 comprise first material 26 (e.g., silicon nitride) which may be wholly or partially sacrificial. Example second tiers 20 comprise second material 24 (e.g., silicon dioxide) that is of different composition from that of first material 26 and which may be wholly or partially sacrificial.

In some embodiments and as shown, an insulator tier 21 is directly above stack 18 (e.g., lower stack 18). Such may comprise any suitable insulative material. In one embodiment, such comprises the same insulative material as in lower second tiers 20 (e.g., insulative material 24). In one embodiment, insulator tier 21 is thicker than (e.g., more than twice as thick as) each of the alternating first tiers and second tiers in the lower stack and in the upper stack to be formed subsequently.

Referring to FIGS. 3 and 4, horizontally-elongated lower trenches 40 have been formed (e.g., by anisotropic etching) into insulator tier 21 and stack 18 to form laterally-spaced lower memory-block regions 58 having trenches 40 therebetween. Lower memory-block regions 58 will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Trenches 40 may have respective bottoms that are directly against conductor material 17 (e.g., atop or within) of conductor tier 16 (as shown) or may have respective bottoms that are above conductor material 17 of conductor tier 16 (not shown).

Channel openings 25 have also been formed (e.g., by anisotropic etching) through tiers 20-22 to conductor tier 16 between lower trenches 40. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row. Any alternate existing or future-developed arrangement and construction may be used.

In one embodiment, trenches 40 and channel openings 25 are formed simultaneously. In one embodiment, trenches 40 and channel openings 25 are formed using one and only one masking step to collectively form trenches 40 and channel openings 25 (regardless of whether formed simultaneously). As an example, trenches 40 and channel openings 25 may be formed using lithography such as photolithography with or without pitch multiplication. Masking material (e.g., photoresist and/or hard-masking material and not shown) may be formed atop insulator tier 21 and patterned to have mask openings therein corresponding to outlines of trenches 40 and channel openings 25. Trenches 40 and channel openings 25 may then be formed by anisotropic etching through such mask openings, with such being an example one masking step and, regardless, an example wherein trenches 40 and channel openings 25 may be formed simultaneously.

Referring to FIGS. 5 and 6, sacrificial material 59 has been formed in lower trenches 40 in insulator tier 21 and in lower stack 18. In one embodiment and as shown, such has also been formed in channel openings 25. An example of forming the FIGS. 5 and 6 construction includes depositing sacrificial material 59 to overfill trenches 40 and openings 25, followed by planarizing such back (e.g., by chemical mechanical polishing) at least to the top surface of insulator tier 21. Sacrificial material 59 is ideally of a composition which can be etched selectively relative to material of tiers 20-22. By way of examples only, elemental tungsten and $Al_2O_3$ are examples. Such materials are each etchable highly selectively relative to silicon dioxide and silicon nitride (in the example gate-first processing being described) using ammonium hydroxide or a mixture of sulfuric acid and hydrogen peroxide. Other materials may be used.

Figure 8:
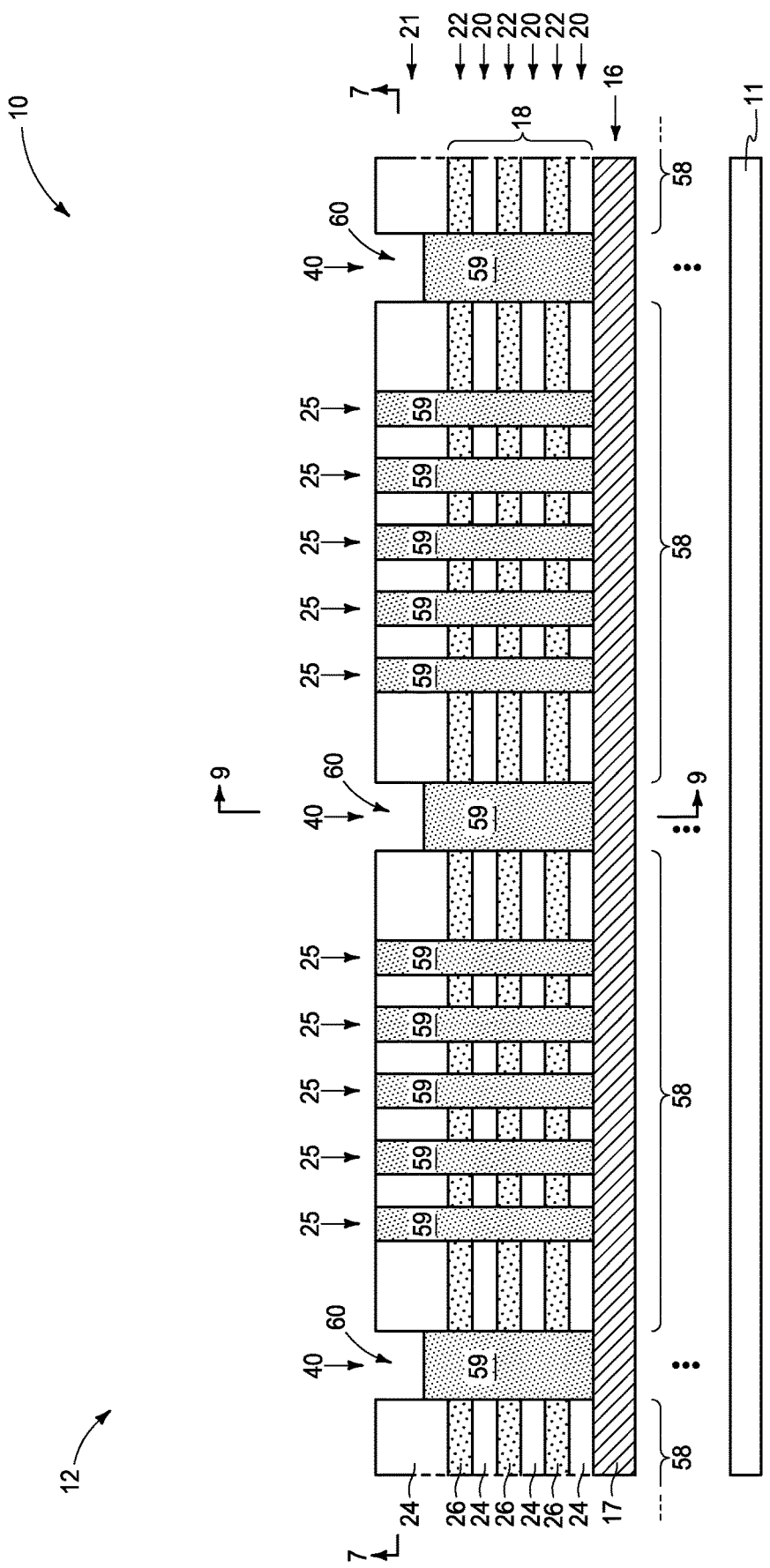
Figure 9:
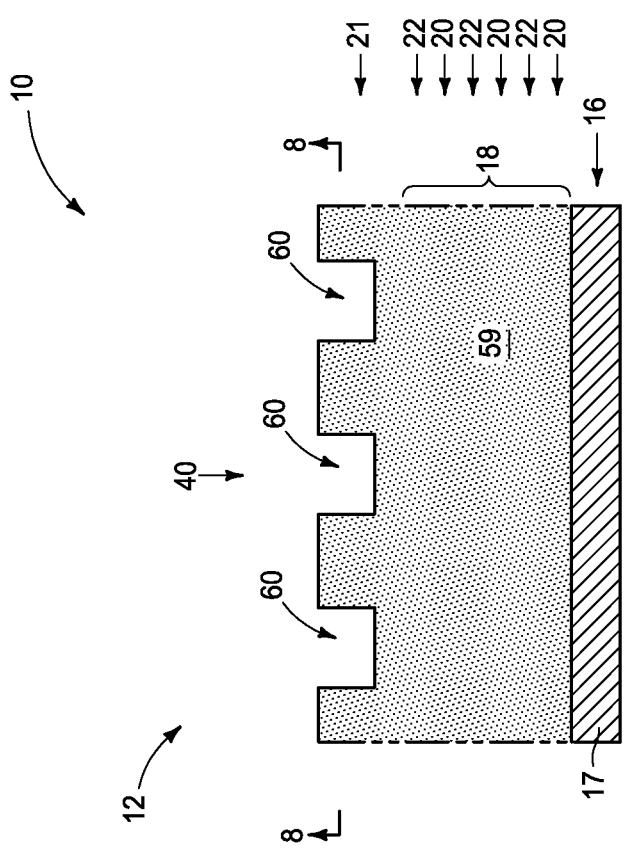
Figure 10:
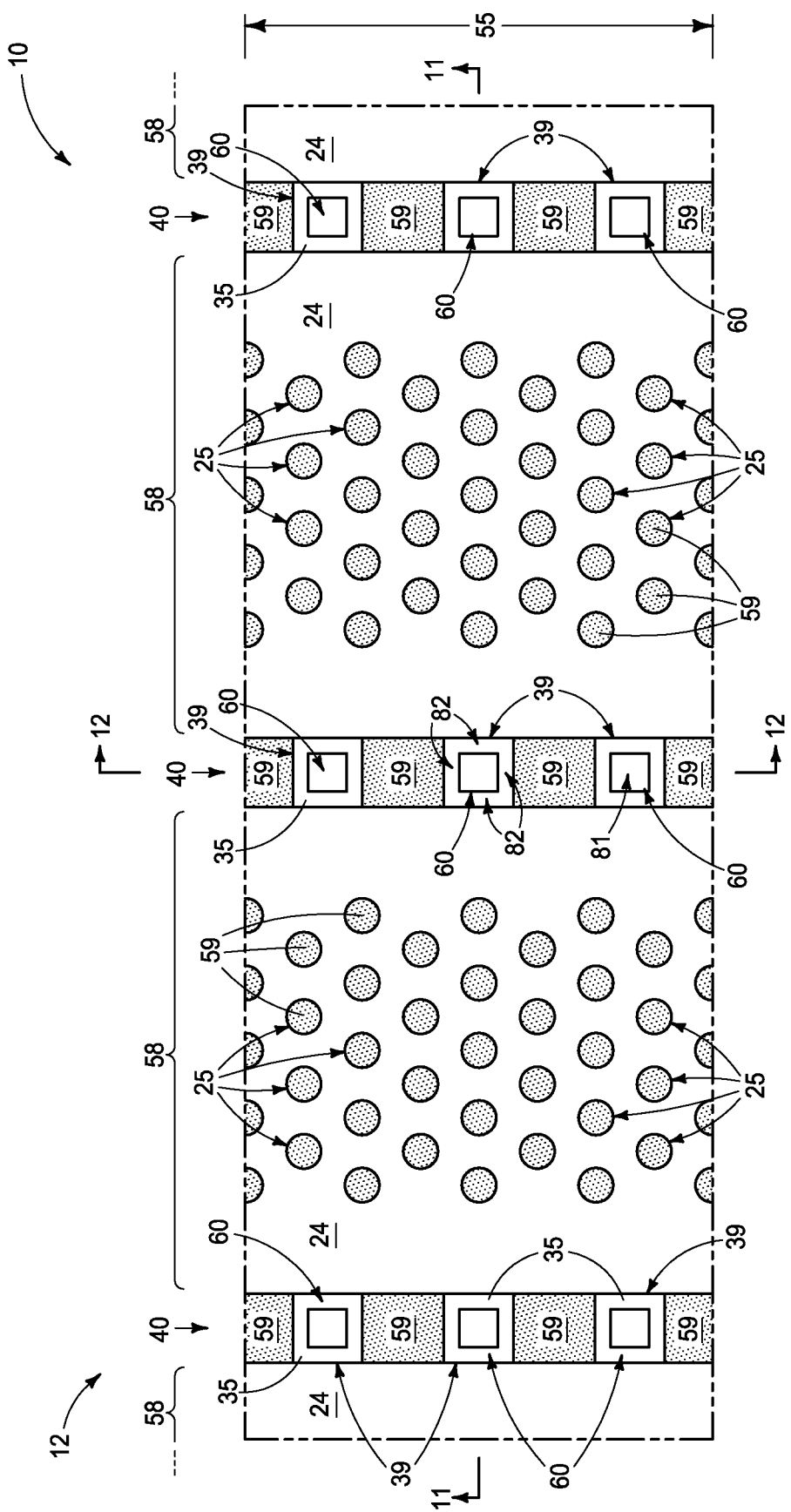
Figure 11:
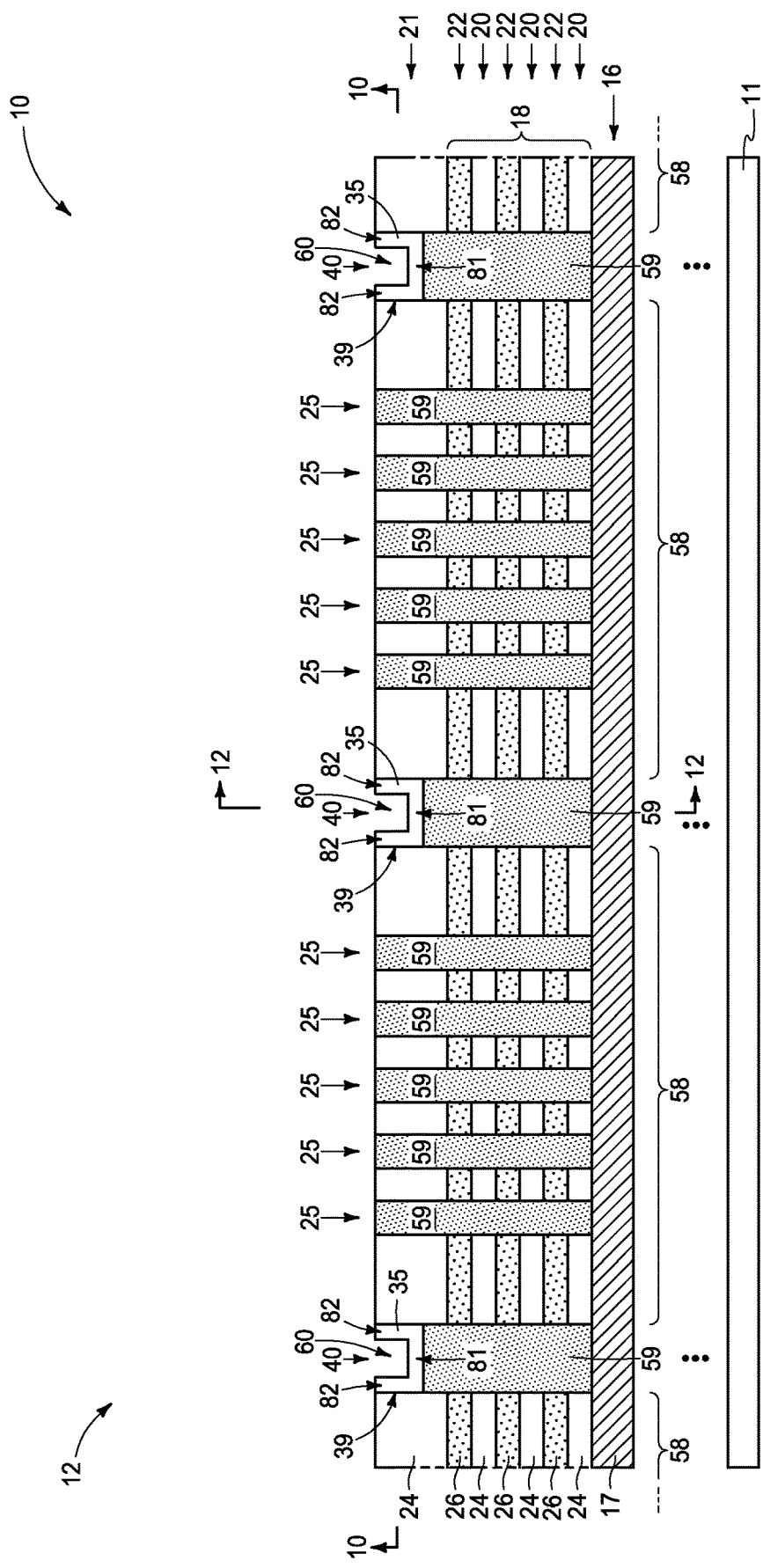
Figure 13:
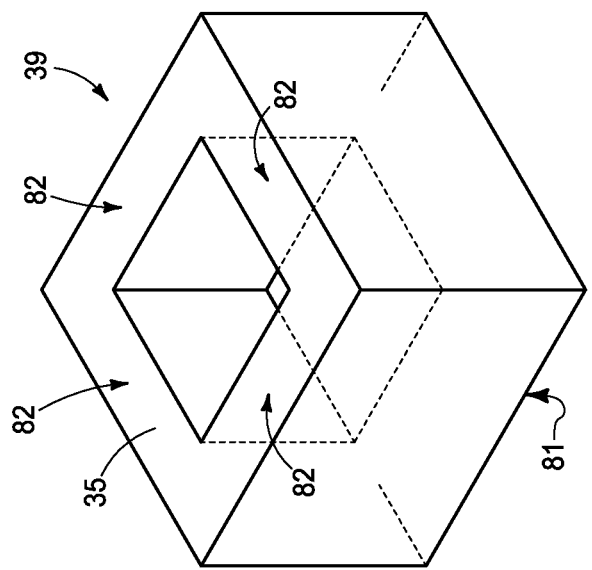
Figure 12:
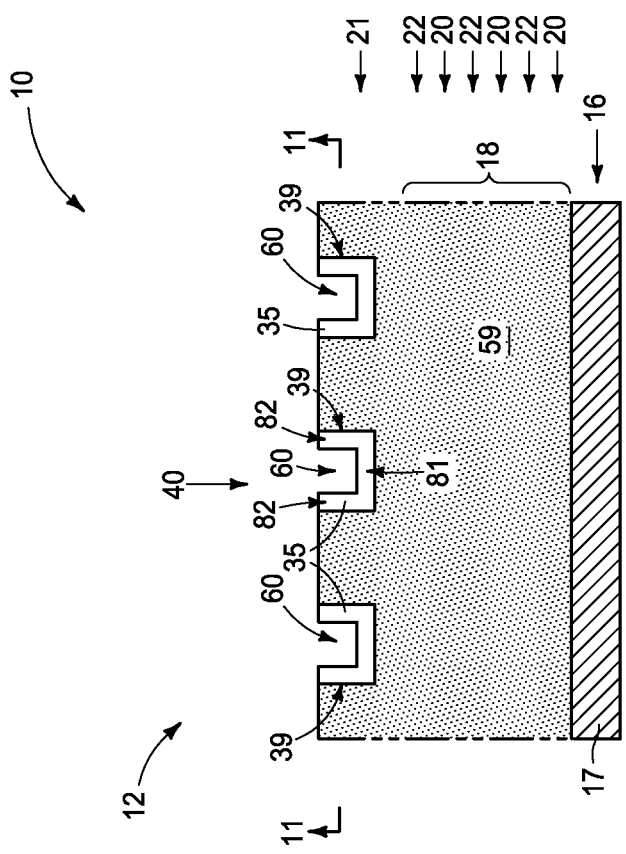

Referring to FIGS. 7-9, vertical recesses 60 have been formed in sacrificial material 59 to extend across lower trenches 40 laterally-between and longitudinally-spaced along immediately-laterally-adjacent lower memory-block regions 58. An example technique for doing so includes forming a masking layer (e.g., an amorphous carbon hard-masking material and not shown) atop insulator tier 21 followed by patterning thereof to form openings therethrough only over regions where vertical recesses 60 are to be formed. This can be followed by timed dry anisotropic etching of sacrificial material 59, with the hard-masking material being removed during and/or after such etching.

Referring to FIGS. 10-13, bridge material 35 has been formed in vertical recesses 60 to line and less-than-fill vertical recesses 60. Bridges 39 have been formed from bridge material 35 and in some embodiments have an upwardly-open cup-like shape, for example as perhaps best shown in isolated FIG. 13. In such example, the upwardly-open cup-like shape is shown as having horizontally-straight sidewalls although circular or other such sidewalls may be formed depending on shape of vertical recesses 60. A manner of forming bridges 39 includes deposition of a conformal blanketing layer of bridge material 35 atop the construction of FIGS. 7-9, followed by planarizing such back (e.g., by chemical mechanical polishing) at least to the top surface of insulator tier 21. Bridges 39 may be insulative, semiconductive, or conductive, with bridge material 35 being one or more of insulative, semi-conductive, or conductive. Ideally, bridges 39 are insulative to preclude any shorting contact with other conductive or semiconductive materials. In one example embodiment, bridge material 35 is of the same composition as that of insulative material 24 of second/insulative tiers 20. Regardless, in some embodiments, bridges 39 in a vertical cross-section (e.g., that of either of FIG. 11 or 12) have a base 81 and at least two spaced walls 82 (regardless of whether at edges of the base) that project upwardly from base 81.

Figure 14:
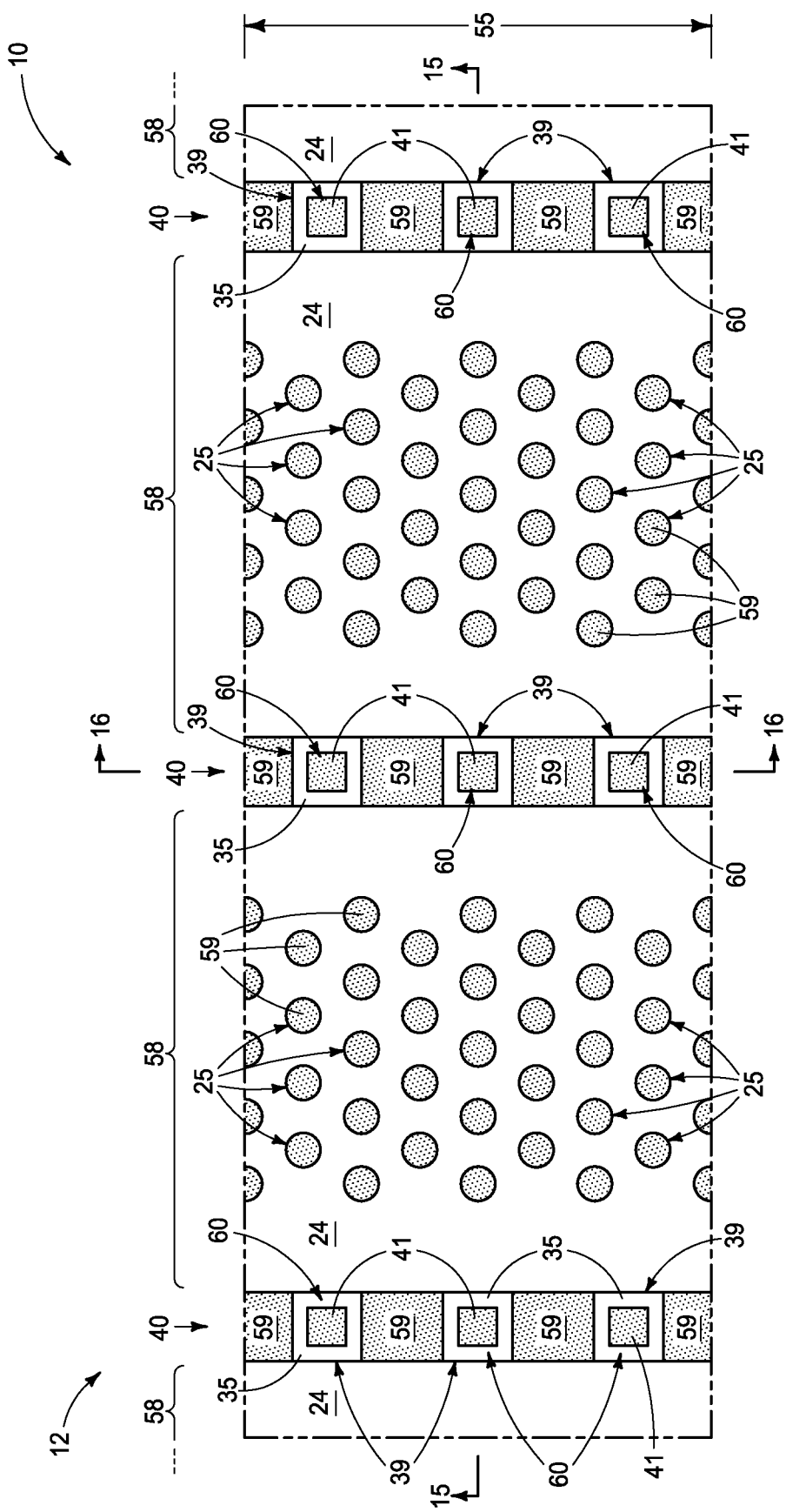
Figure 15:
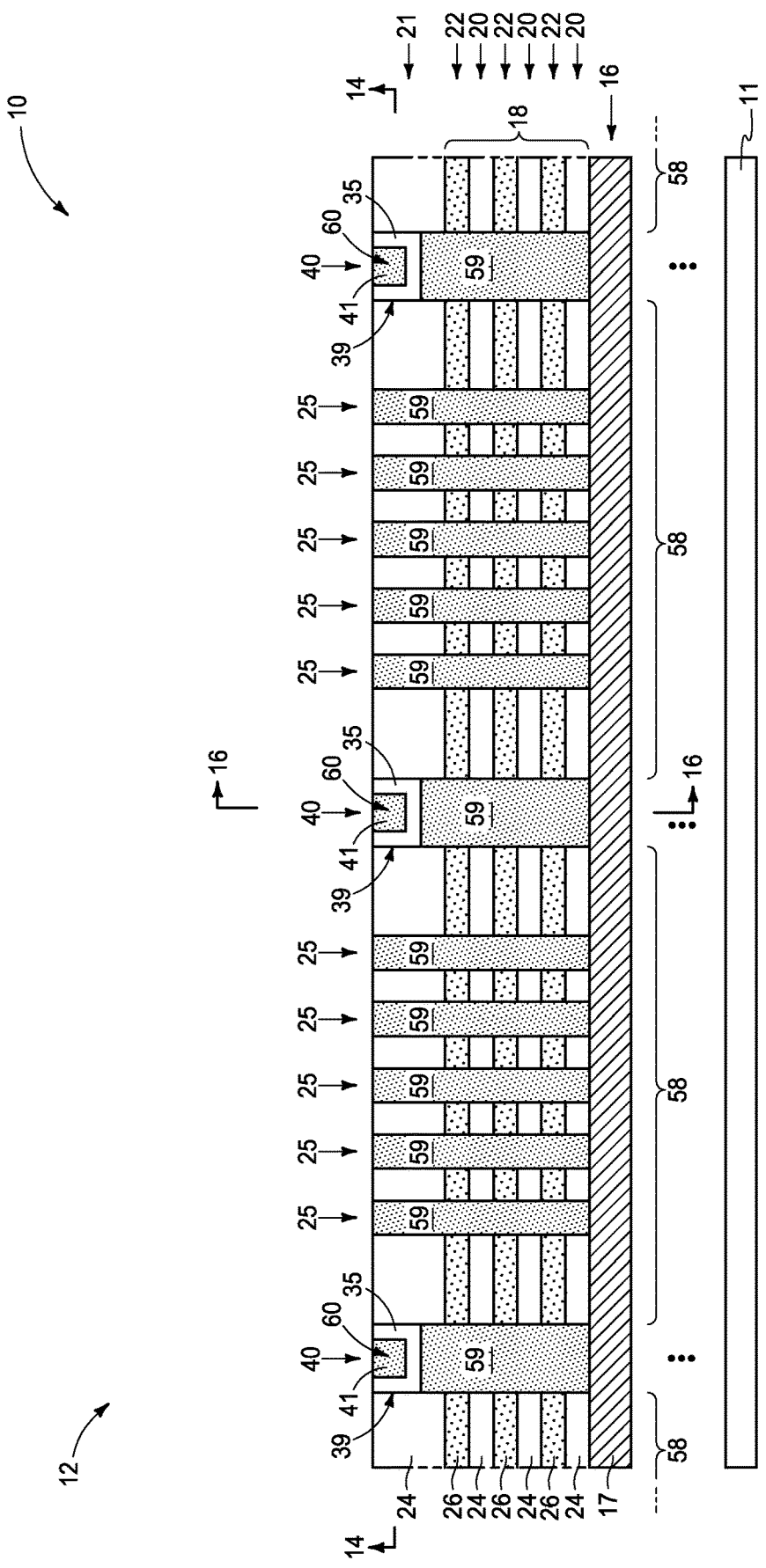
Figure 16:
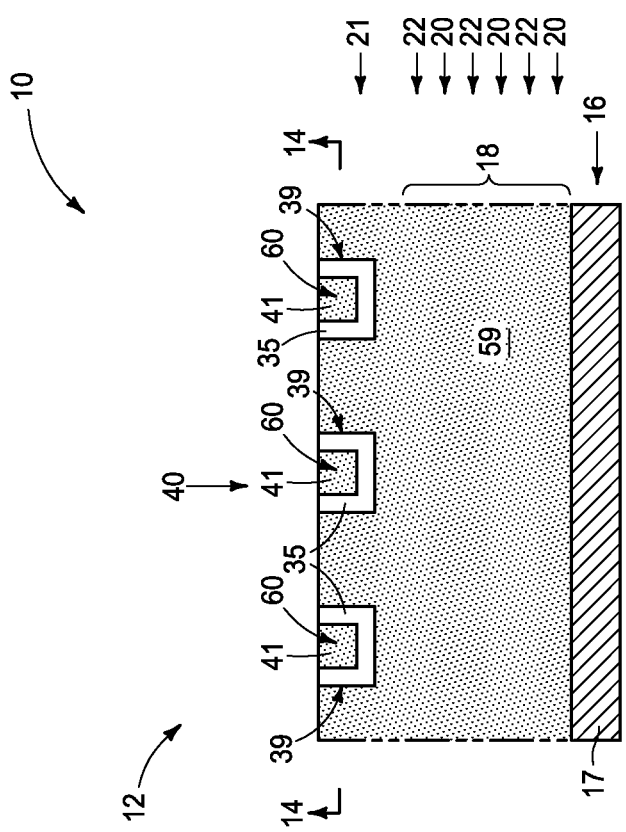

Referring to FIGS. 14-16, etch-stop material 41 has been formed in the upwardly-open cup-like shape of bridges 39. Such will function as an etch-stop for an etch described below. In one embodiment, etch-stop material 41 and sacrificial material 59 are of the same composition relative one another and in another embodiment are of different compositions relative one another. An example technique for forming the FIGS. 14-16 construction is to deposit etch-stop material 41 to overfill the upwardly-open cup-like shape of bridges 39, followed by planarizing such back at least to the top of insulator tier 21 and bridges 39 (e.g., by chemical mechanical polishing).

Figure 17:
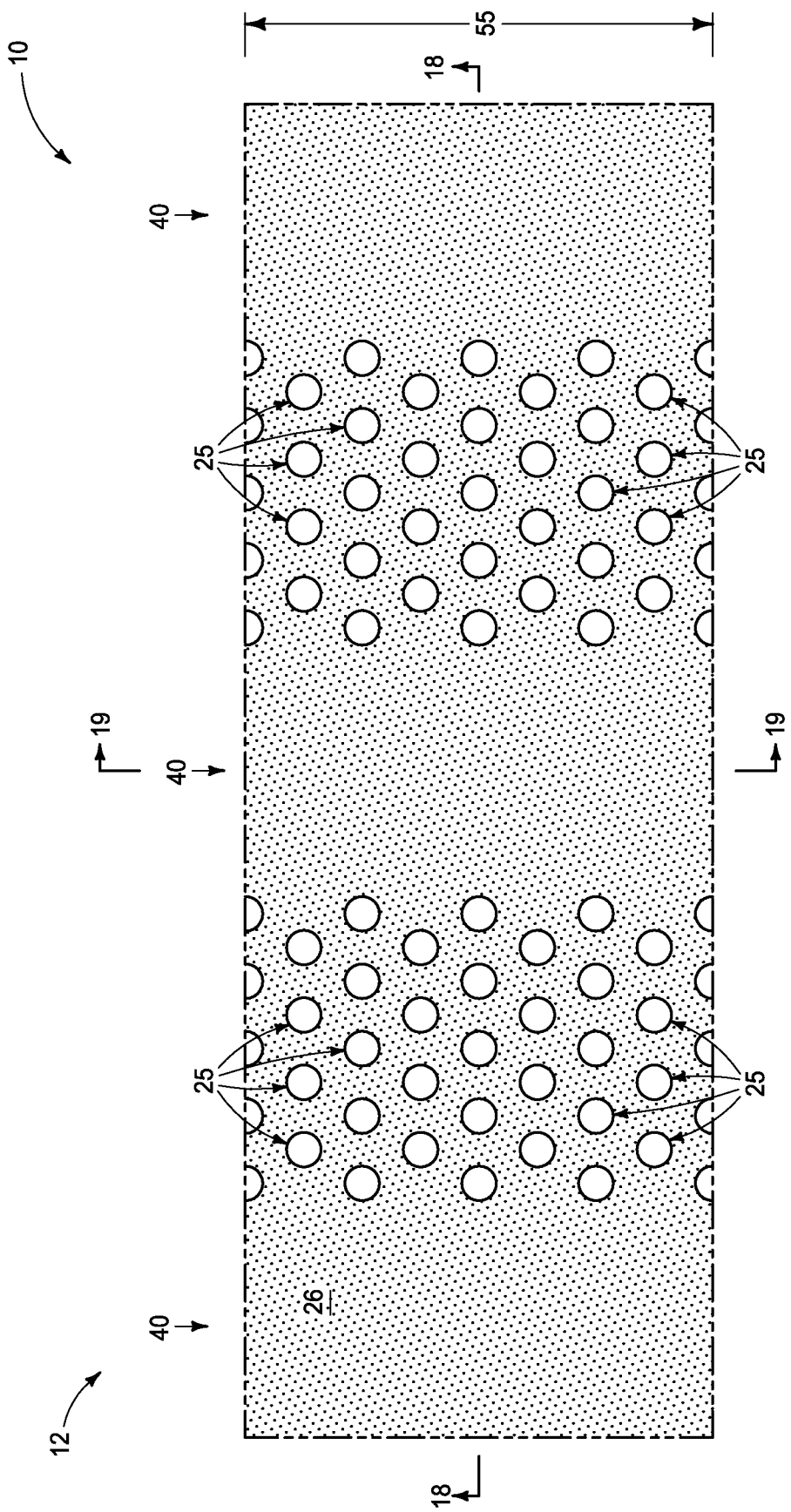
Figure 18:
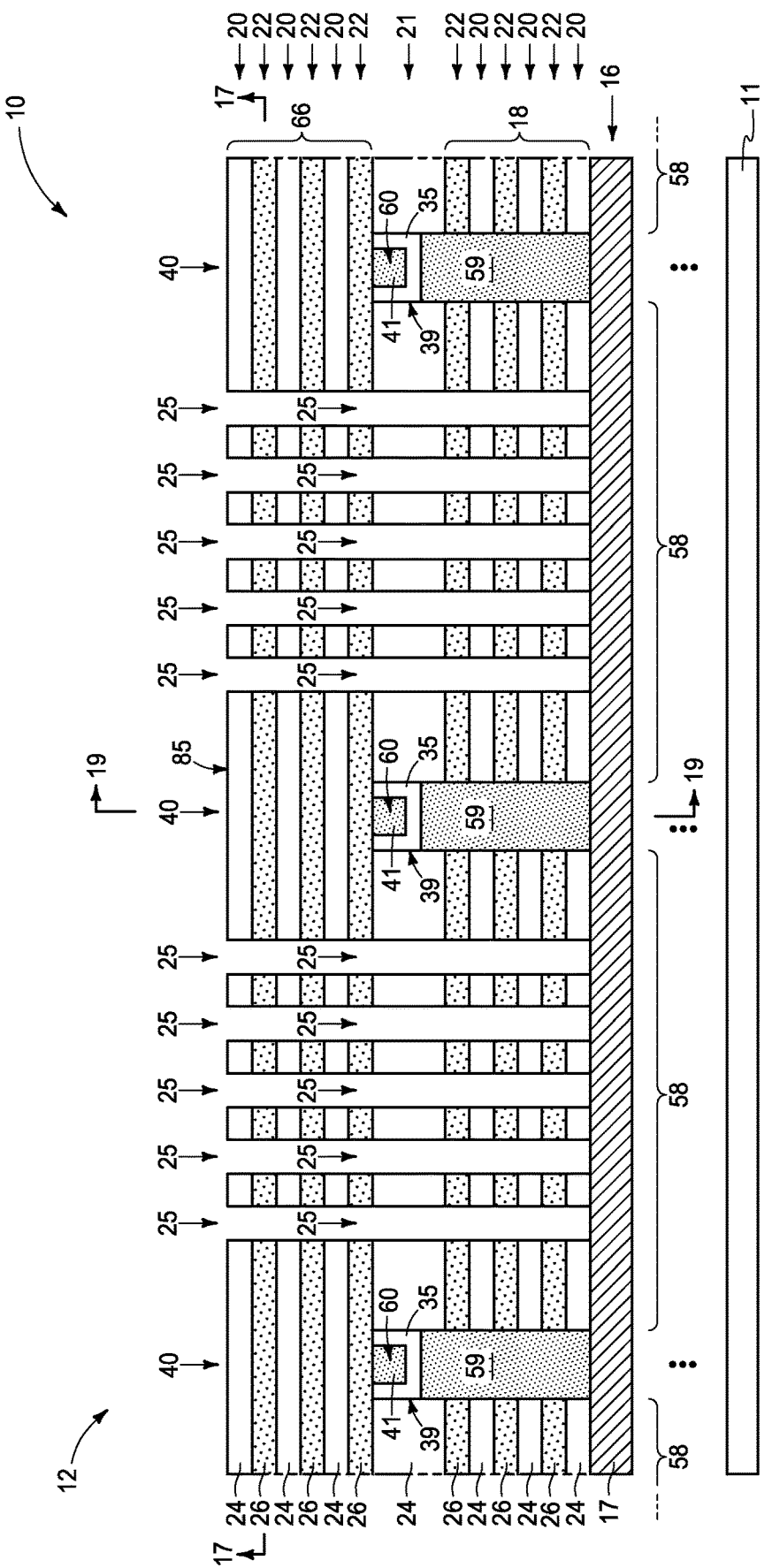
Figure 19:
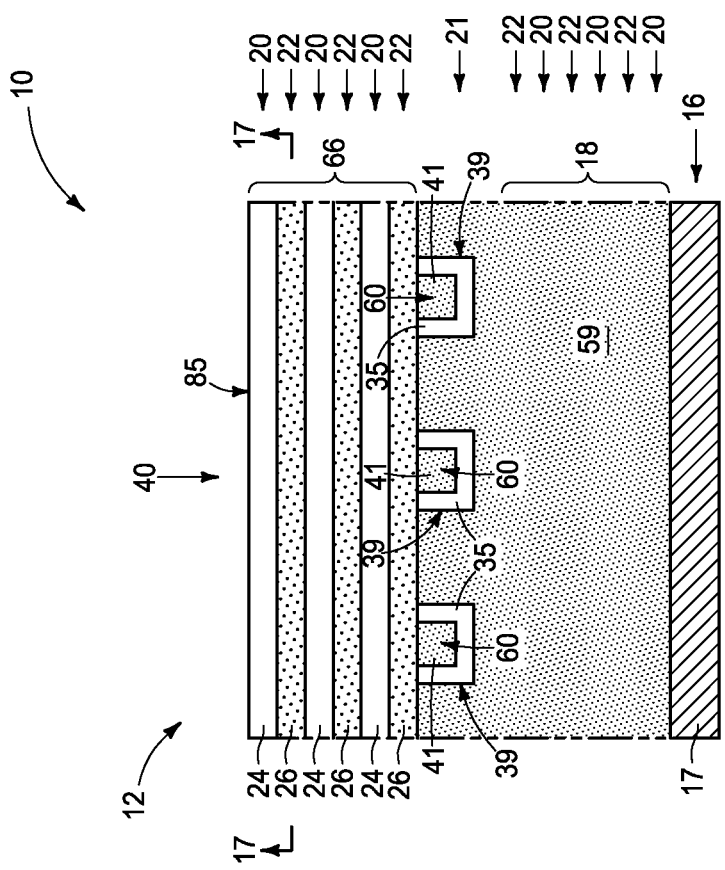
Figure 20:
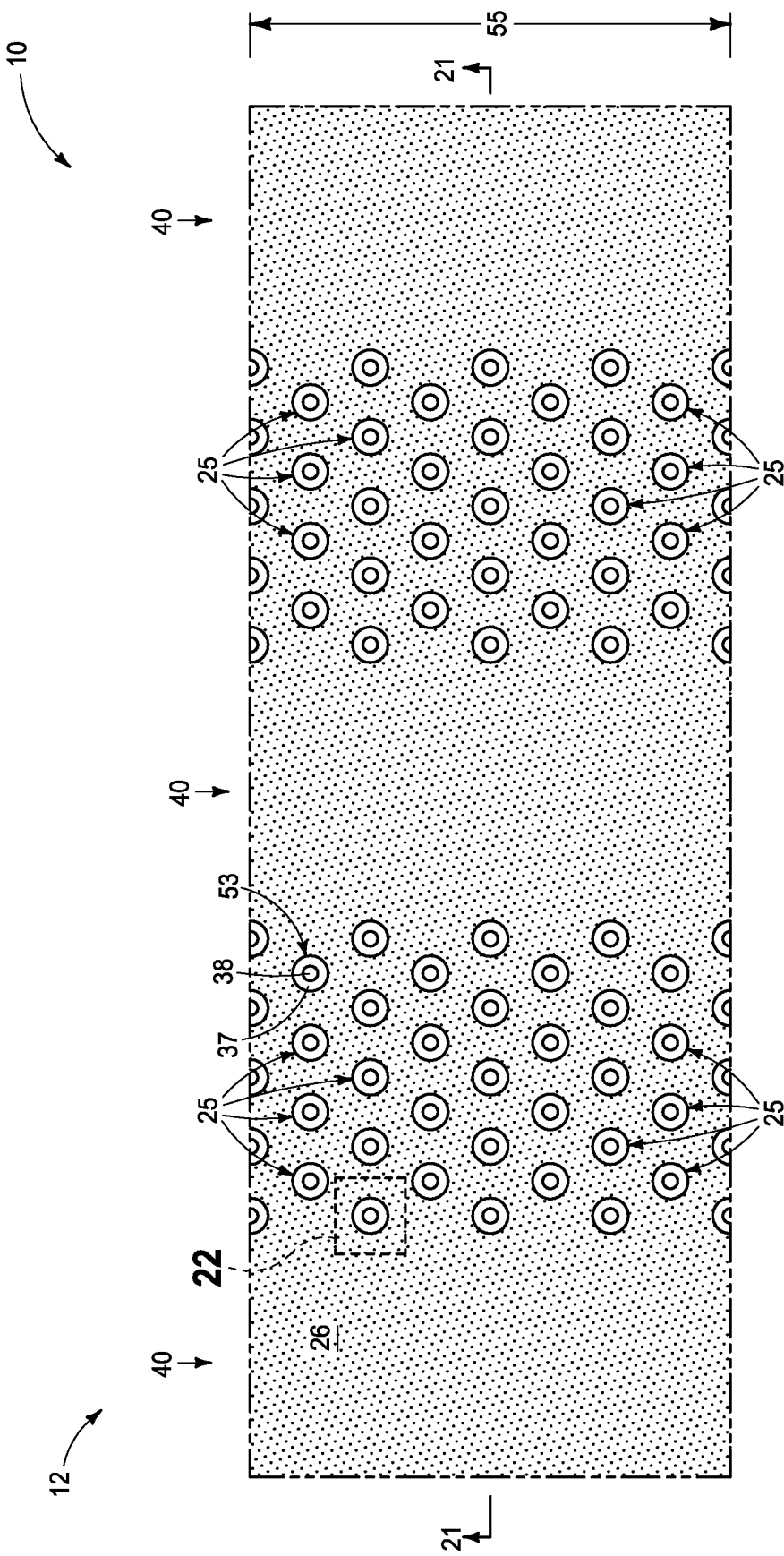
Figure 21:
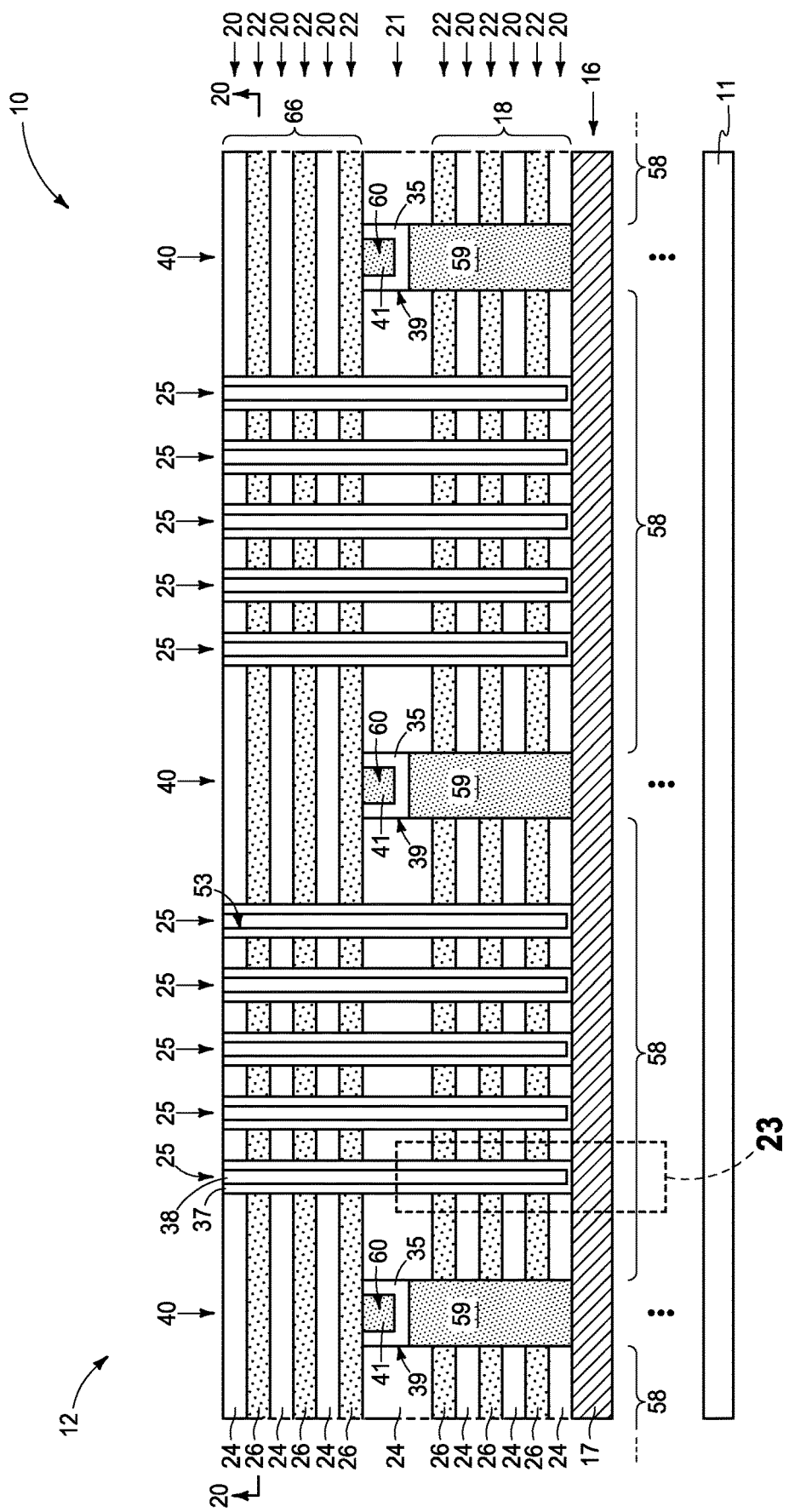
Figure 23:
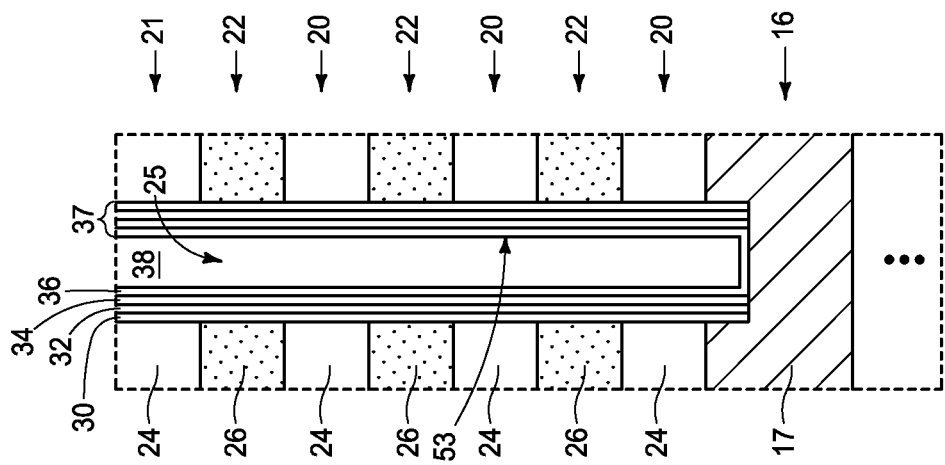
Figure 22:
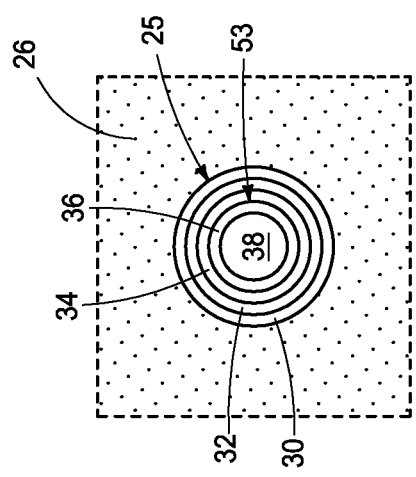

Referring to FIGS. 17-19, an upper stack 66 comprising vertically alternating upper first tiers 22 and upper second tiers 20 has been formed directly above bridges 39 and etch-stop material 41. The upper and lower first tiers and the upper and lower second tiers, including their respective composition(s), may be the same or different relative one another, including their respective thicknesses. In one embodiment and as shown, the first tiers and the second tiers are of the same compositions 26 and 24, respectively, in upper stack 66 and lower stack 18. Channel openings 25 have been formed in upper stack 66 directly above and to channel openings 25 and lower stack 18. This has been followed by removing sacrificial material 59 from interconnected channel openings 25 as shown (material 59 thereby not being shown in openings 25 in FIGS. 17 and 18). Regardless, stack 66/18 may be considered in some embodiments as having a top 85.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 20-23 show one embodiment where charge-blocking material 30, storage material 32, and charge-passage material 34 have been formed in individual interconnected channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual interconnected channel openings 25 followed by planarizing such back at least to a top surface of stack 18. Channel material 36 has also been formed in interconnected channel openings 25 elevationally along insulative tiers 20 and conductive tiers 22, thus comprising individual operative channel-material strings 53. Materials 30, 32, 34, and 36 are collectively shown as and only designated as material 37 in FIGS. 20 and 21 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of interconnected channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Interconnected channel openings 25 are shown as comprising a radially-central solid dielectric material 38 (e.g., spin-on-dielectric, silicon dioxide, and/or silicon nitride). Alternately, and by way of example only, the radially-central portion within interconnected channel openings 25 may include void space(s) (not shown) and/or be devoid of solid material (not shown). Conductive plugs (not shown) may be formed to channel-material strings 53 for better conductive connection to overlying circuitry (not shown).

Figure 24:
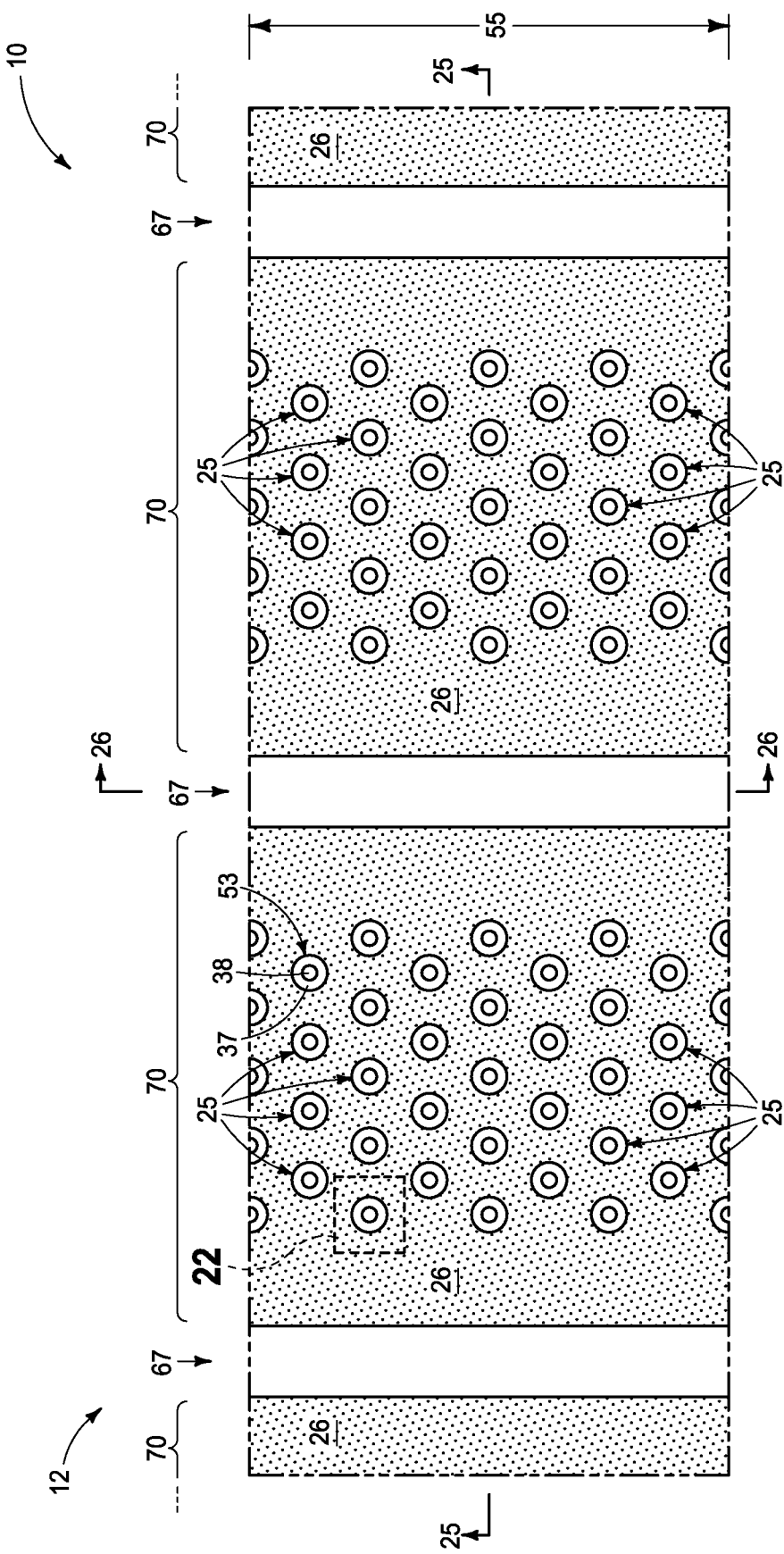
Figure 25:
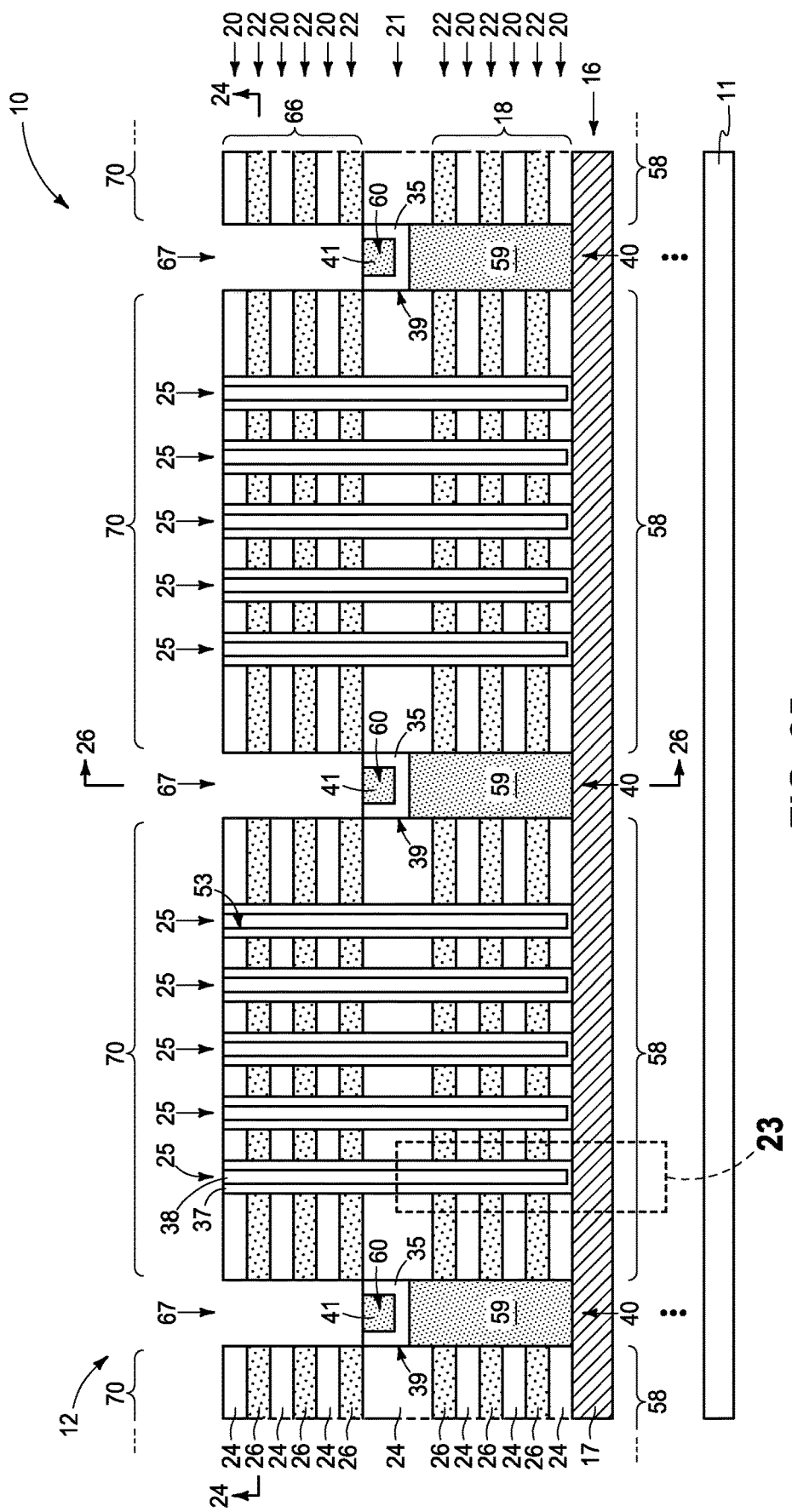
Figure 26:
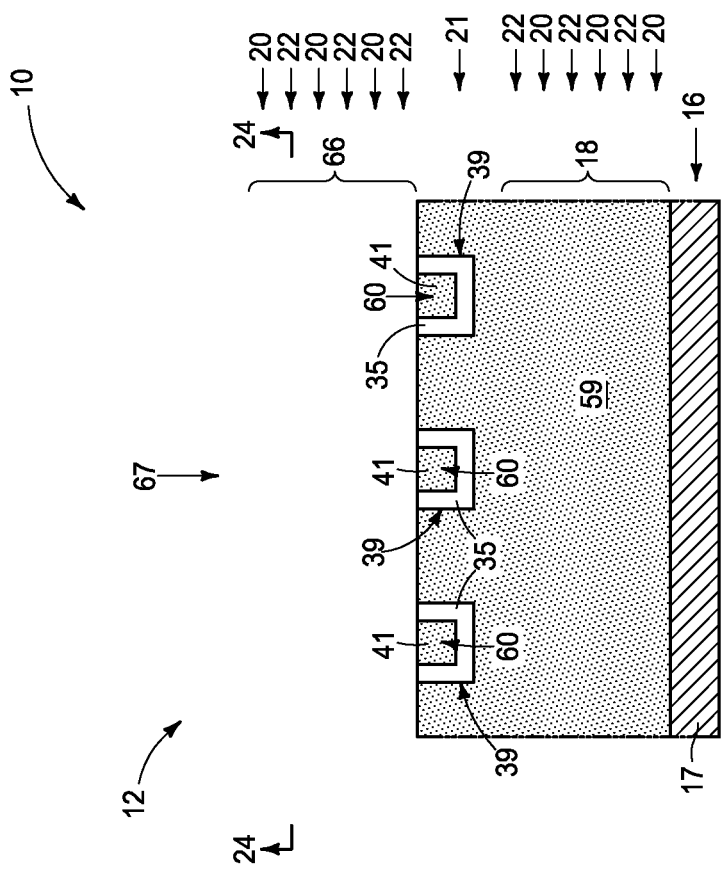

Referring to FIGS. 24-26, horizontally-elongated upper trenches 67 have been etched into upper stack 66 directly above lower trenches 40 to etch-stop material 41 in the upwardly-open cup-like shape of bridges 39. Such forms laterally-spaced upper memory-block regions 70 that are directly above lower memory block-regions 58. The artisan is capable of selecting suitable dry anisotropic etching chemistries, for example, for etching upper trenches 67 in upper stack 66 to stop on (i.e., atop or within) etch-stop material 41 (and/or bridge material 35). Edges of upper memory-block regions 70 and lower memory block-regions 58 may or may not perfectly align (perfect alignment being shown), and upper memory-block regions 70 and lower memory block-regions 58 need not be of identical shape and/or size.

Figure 27:
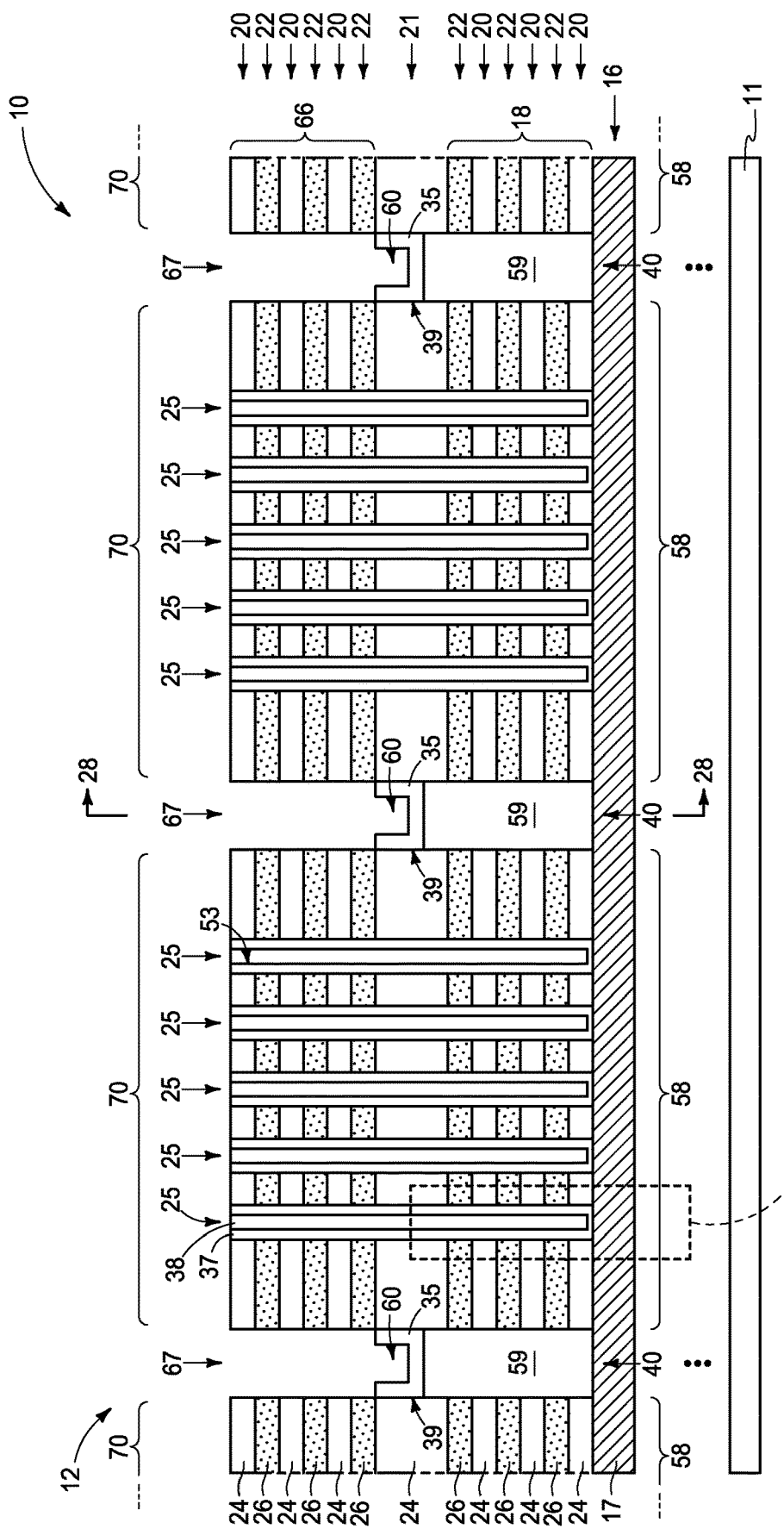
Figure 28:
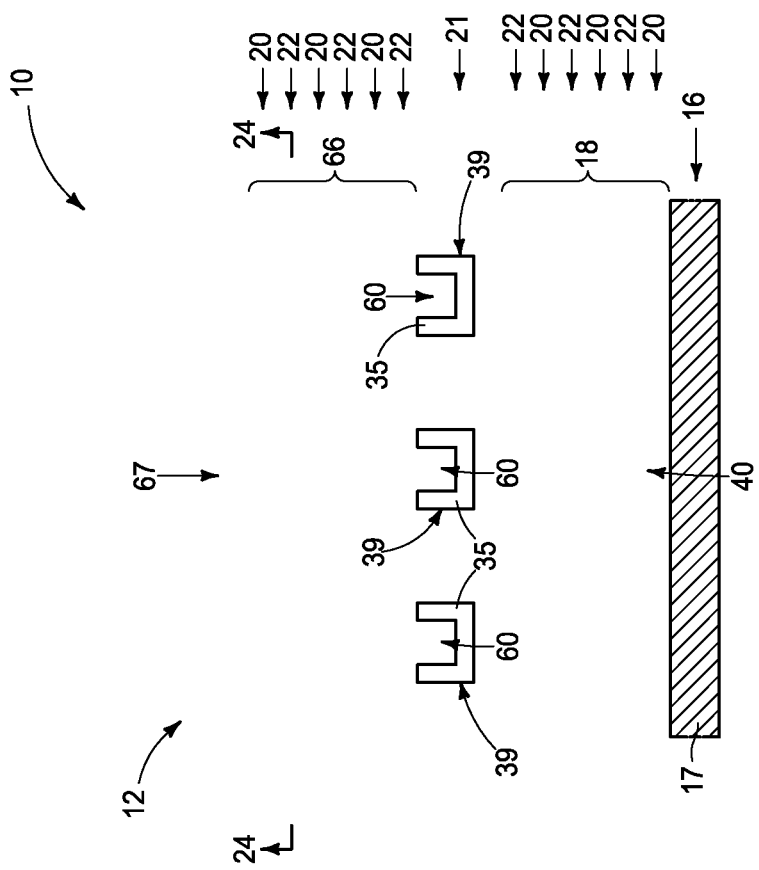
Figure 29:
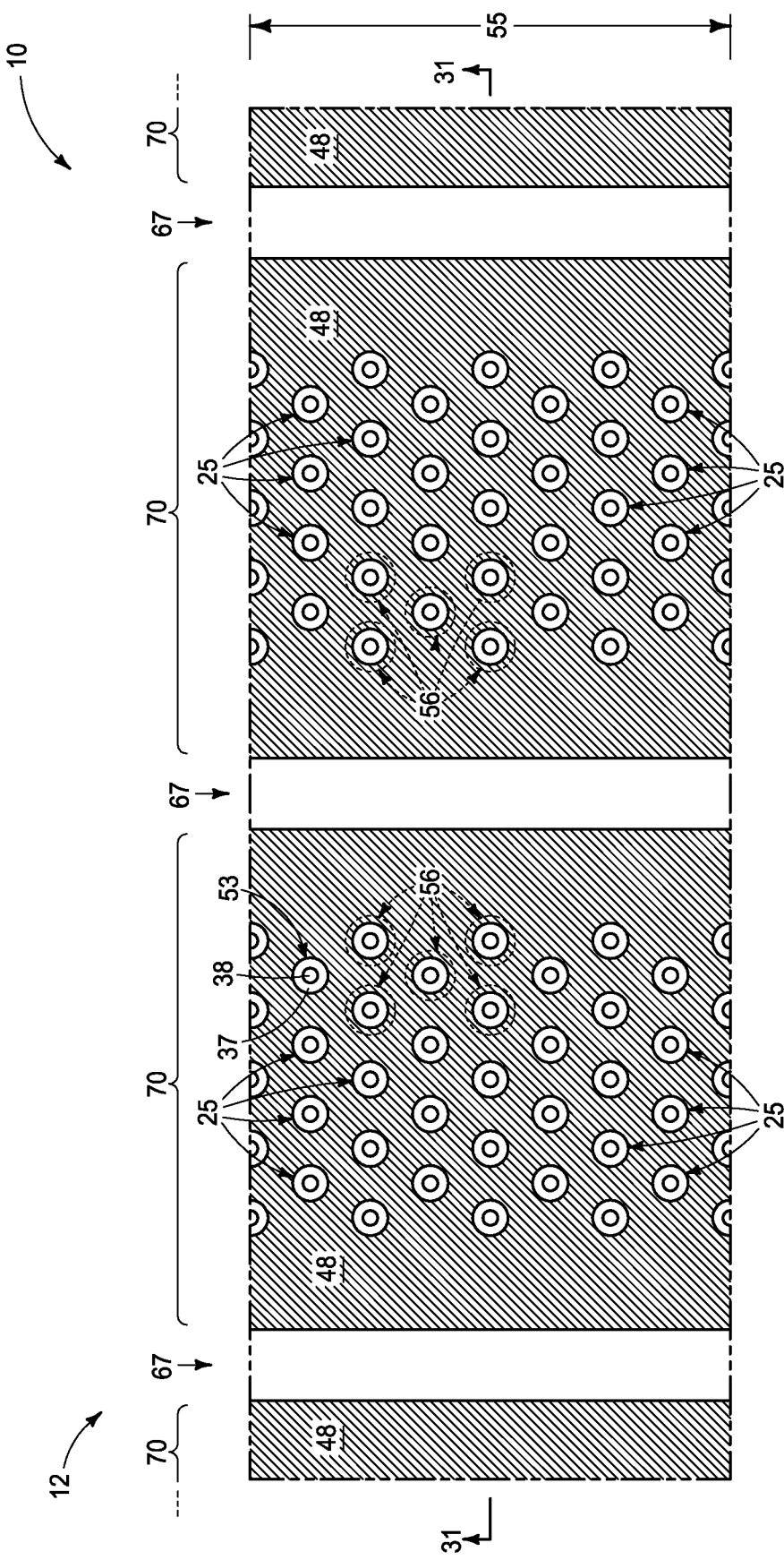
Figure 30:
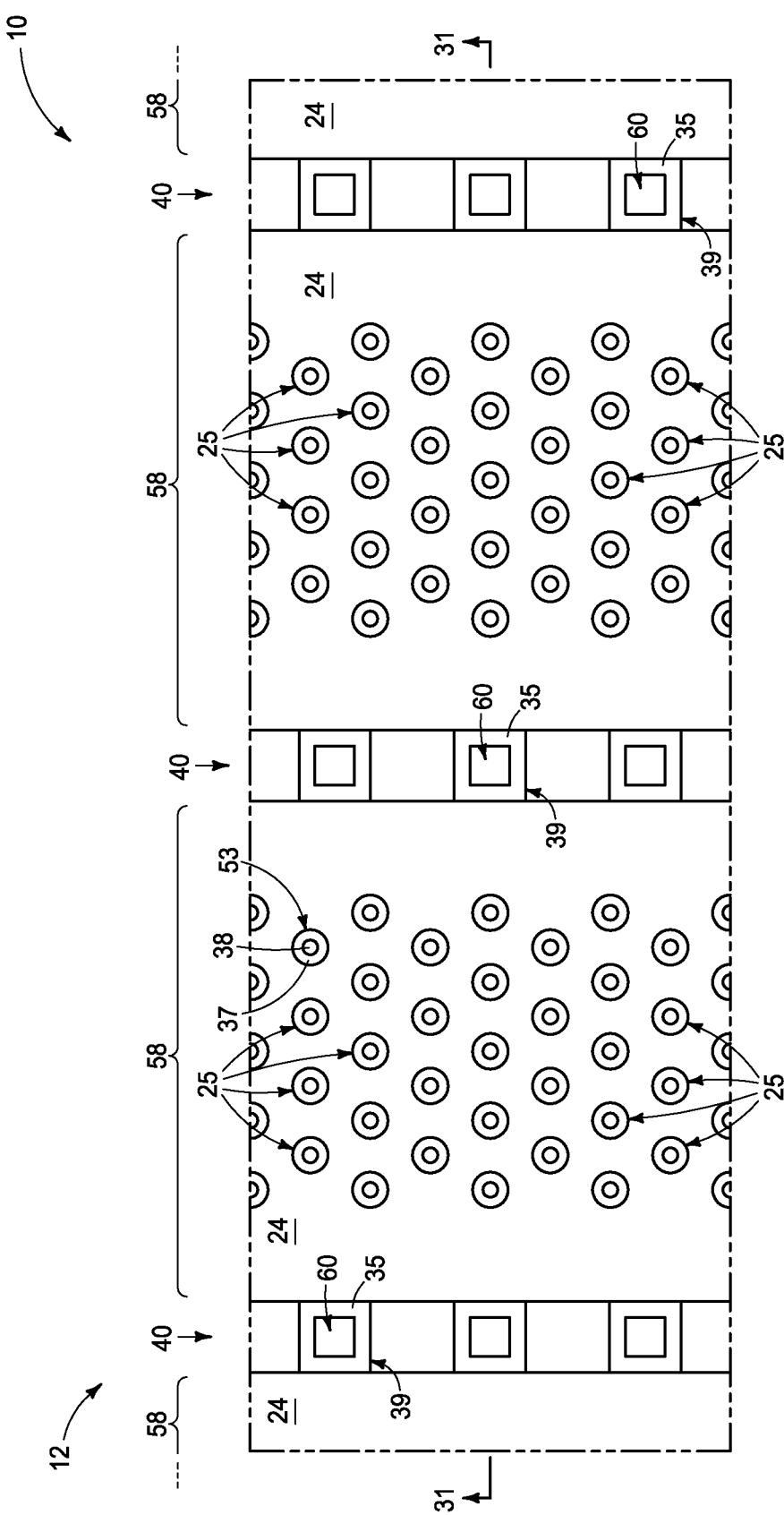
Figure 31:
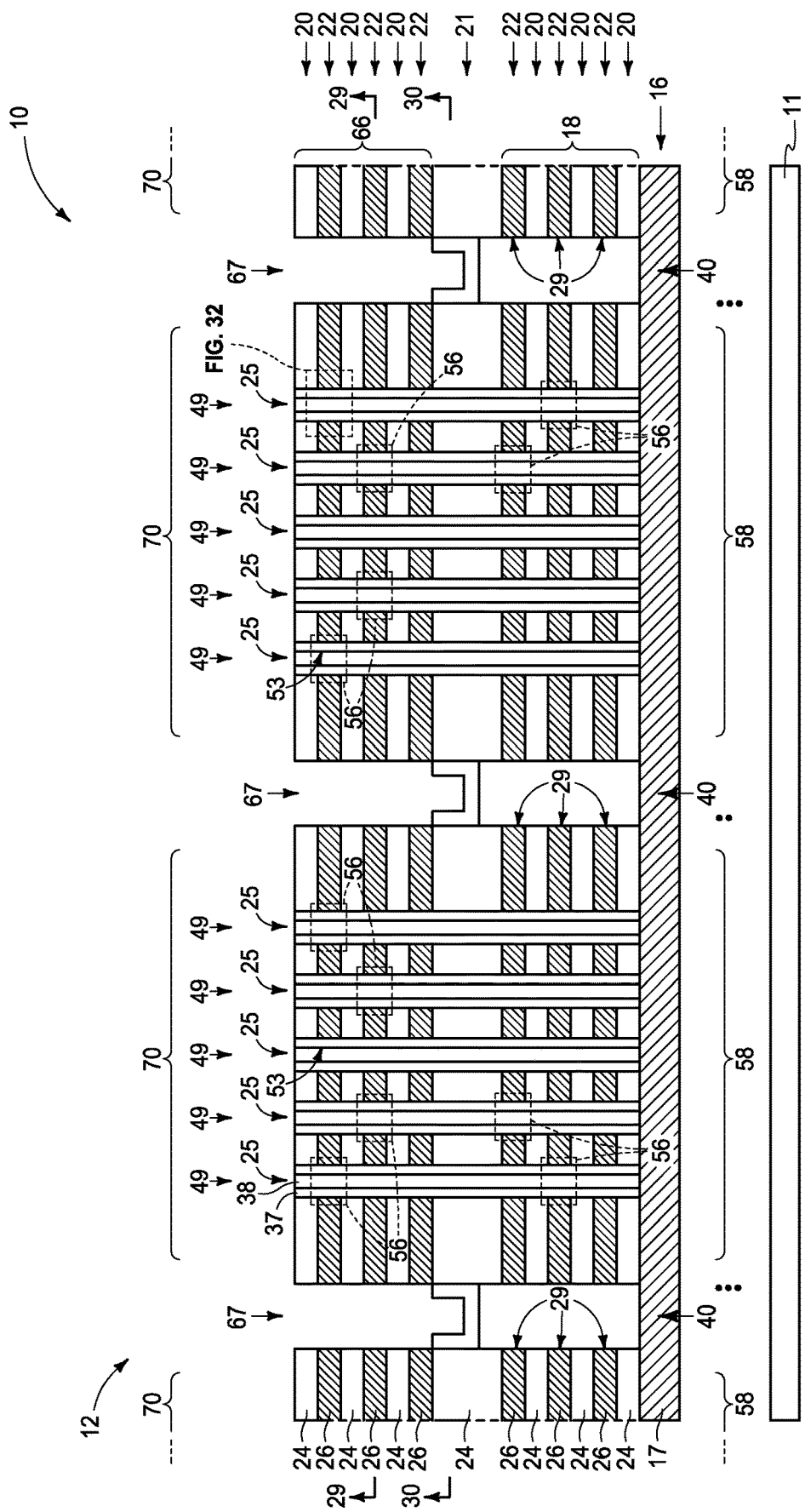
Figure 32:
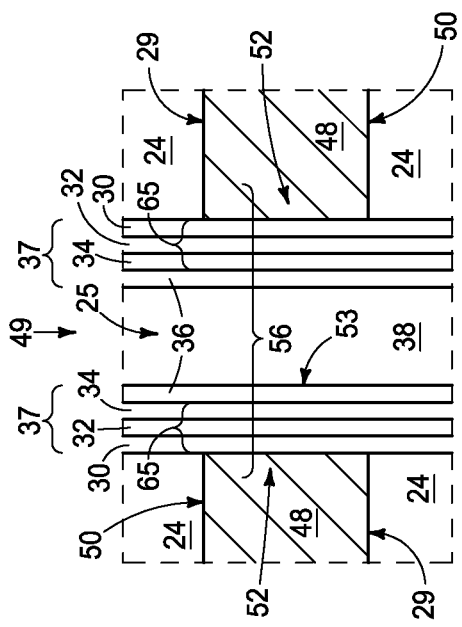
Figure 33:
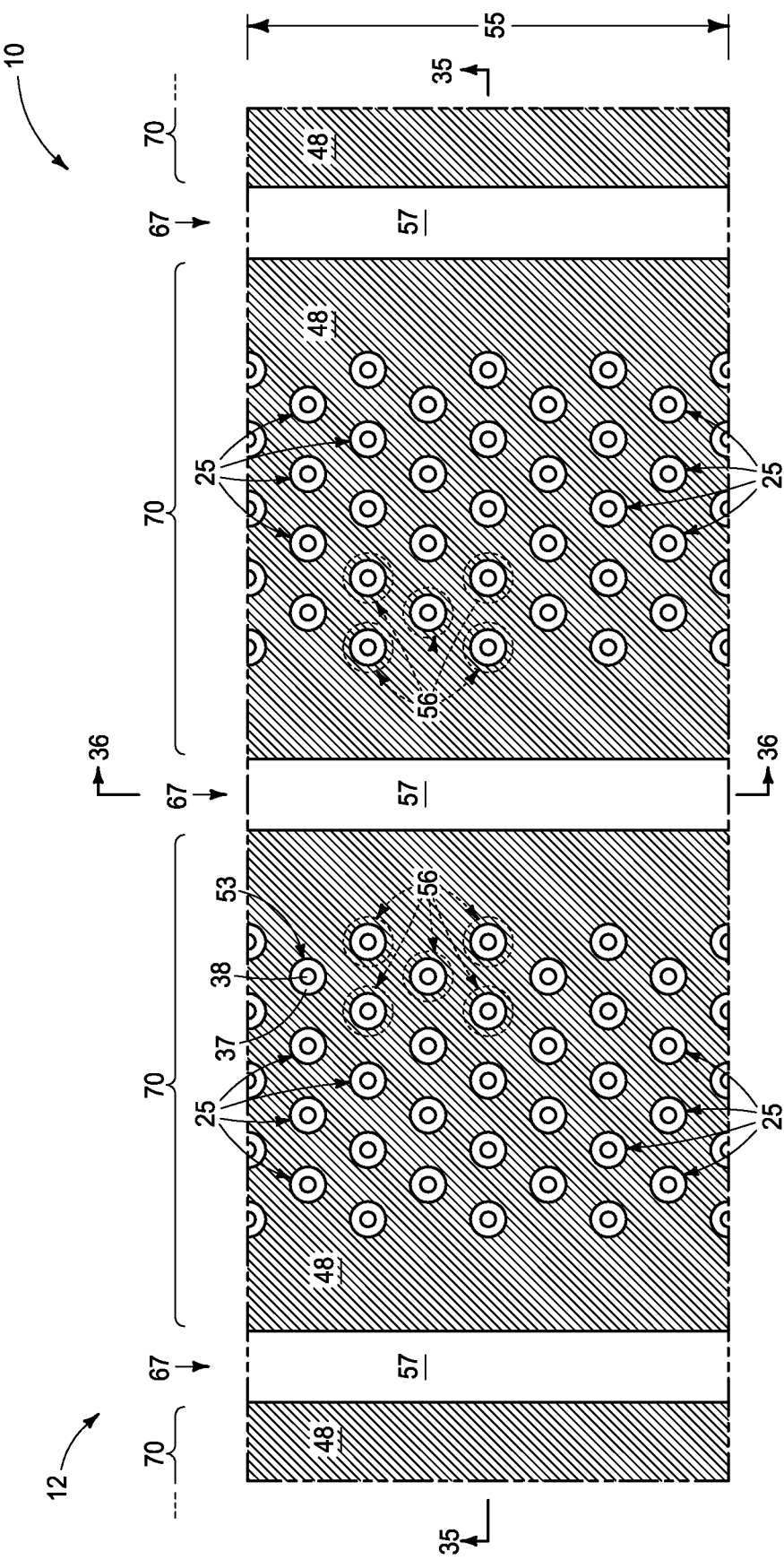

The sacrificial material in the lower trenches is ultimately replaced with intervening material in the lower stack and that is directly under the bridges and, in one embodiment, is in the upper stack directly above the bridges. FIGS. 27 and 28 show removal of etch-stop material 41 (not shown) and sacrificial material 59 (not shown) from trenches 40. In one embodiment and as shown, sacrificial material 59 (not shown) has been removed from channel openings 25 before removing sacrificial material 59 from trenches 40 (e.g., as shown by FIGS. 17 and 18). FIGS. 27 and 28 show an example embodiment where in all remaining etch-stop material 41 (not shown) has been etched away after forming upper trenches 67 and in one embodiment which may be conducted at the same time as etching away sacrificial material 59.

Referring to FIGS. 29-32, and in one embodiment, material 26 (not shown) of conductive tiers 22 has been removed, for example by being isotropically etched away ideally selectively relative to the other exposed materials (e.g., using liquid or vapor $H_3PO_4$ as a primary etchant where material 26 is silicon nitride, and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) in first tiers 22. Such has also formed elevationally-extending strings 49 of individual transistors and/or memory cells 56 comprising channel-material strings 53, and portions of conductive lines 29.

A thin insulative liner (e.g., $Al_2O_3$ and not shown) may be formed before forming conducting material 48. Approximate locations of transistors and/or memory cells 56 are indicated with a bracket in FIG. 32 and some with dashed outlines in FIGS. 29 and 31, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 32) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Referring to FIGS. 33-36, intervening material 57 has been formed in trenches 67 and 40, in lower stack 18, and that is directly under bridges 39. In one embodiment and as shown, intervening material 57 has been formed in upper stack 66 directly above bridges 39. Such is but one example of replacing the sacrificial material in the lower trenches with intervening material in the lower stack that is directly under the bridges, and of forming the intervening material in the upper stack directly above the bridges. Intervening material 57 may provide lateral electrical isolation (insulation) between immediately-laterally-adjacent memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (TAV's) and not shown.

While the example above processing was shown and described as being relative to upper and lower stacks, such processing may alternately occur with respect to only a single stack of vertically-alternating first and second tiers or with more than just an upper stack and a lower stack.

Any other attribute(s) or aspect(s) as shown and/or described herein with respect to other embodiments may be used in the embodiments shown and described with reference to FIGS. 1-36.

In one embodiment, a method used in forming a memory array (e.g., 12) comprising strings (e.g., 49) of memory cells (e.g., 56) comprises forming a stack (e.g., 18 and/or 66) comprising vertically-alternating first tiers and second tiers (e.g., 22 and 20, respectively). Simultaneously forming of (a) and (b) is conducted, where (a): horizontally-elongated trenches (e.g., 40 and/or 67) into the stack to form laterally-spaced memory-block regions (e.g., 58 and/or 70); and (b): channel openings (e.g., 25) into the stack laterally-between the horizontally-elongated trenches (regardless of whether forming bridges). Channel-material strings (e.g., 53) are formed in the channel openings. Intervening material (e.g., 57) is formed laterally-between and longitudinally-along the immediately-laterally-adjacent memory-block regions. In one such embodiment, bridges (e.g., 39) are formed in the trenches to have an upwardly-open cup-like shape (regardless or where such are elevationally in the stack). Any other attribute(s) or aspect(s) as shown and/or described herein with respect to other embodiments may be used.

In one embodiment, a method used in forming a memory array (e.g., 12) comprising strings (e.g., 49) of memory cells (e.g., 56) comprises forming a stack (e.g., 18 and/or 66) comprising vertically-alternating first tiers and second tiers (e.g., 22 and 20, respectively). One and only one masking step is used to collectively form (a) and (b), where (a): horizontally-elongated trenches (e.g., 40 and/or 67) into the stack to form laterally-spaced memory-block regions (e.g., 58 and/or 70); and (b): channel openings (e.g., 25) into the stack laterally-between the horizontally-elongated trenches (regardless of whether forming bridges and regardless of whether (a) and (b) are formed simultaneously). Channel-material strings (e.g., 53) are formed in the channel openings. Intervening material (e.g., 57) is formed laterally-between and longitudinally-along the immediately-laterally-adjacent memory-block regions. In one such embodiment, bridges (e.g., 39) are formed in the trenches to have an upwardly-open cup-like shape (regardless of where such are elevationally in the stack). Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

Figure 34:
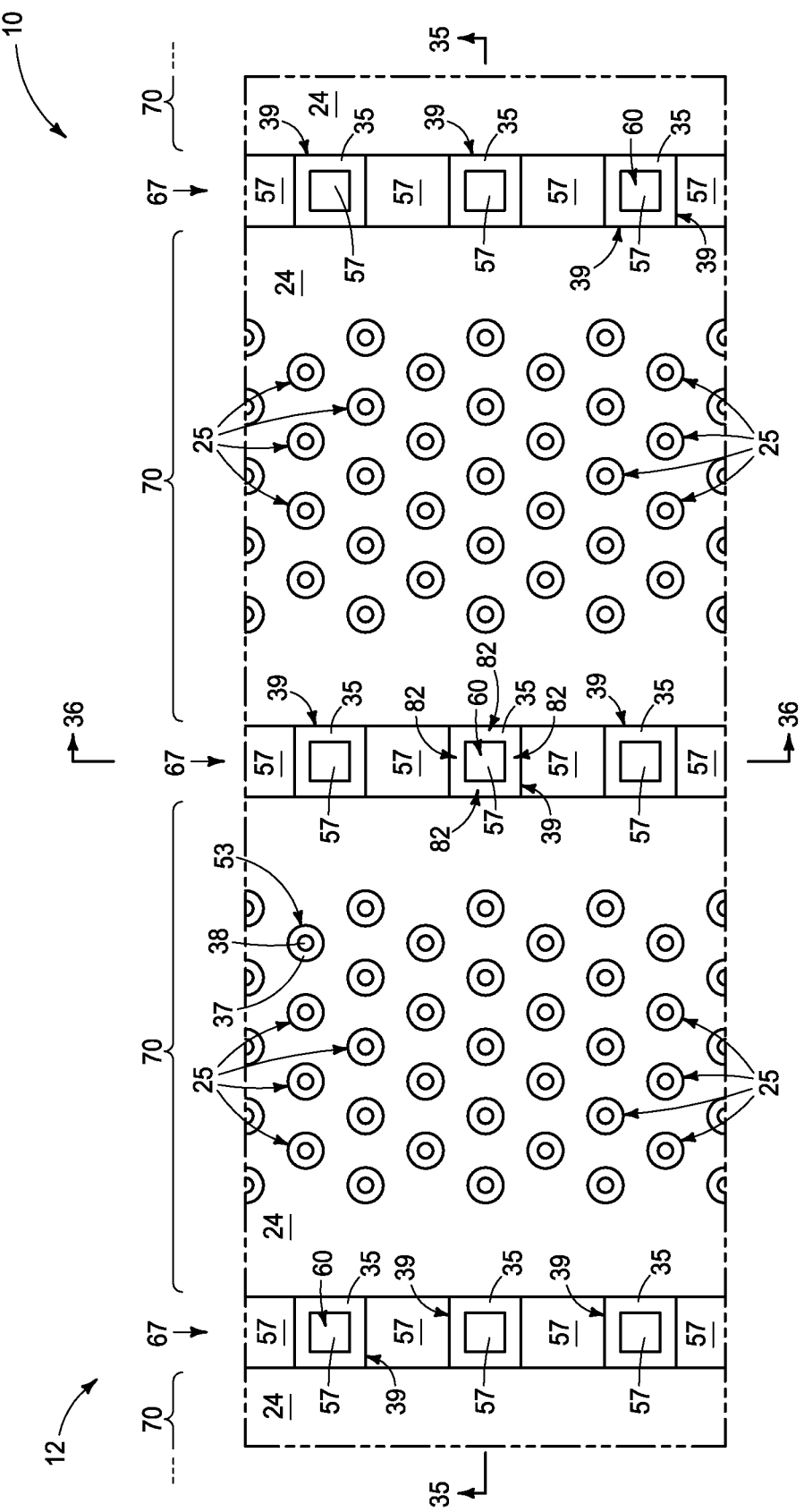
Figure 35:
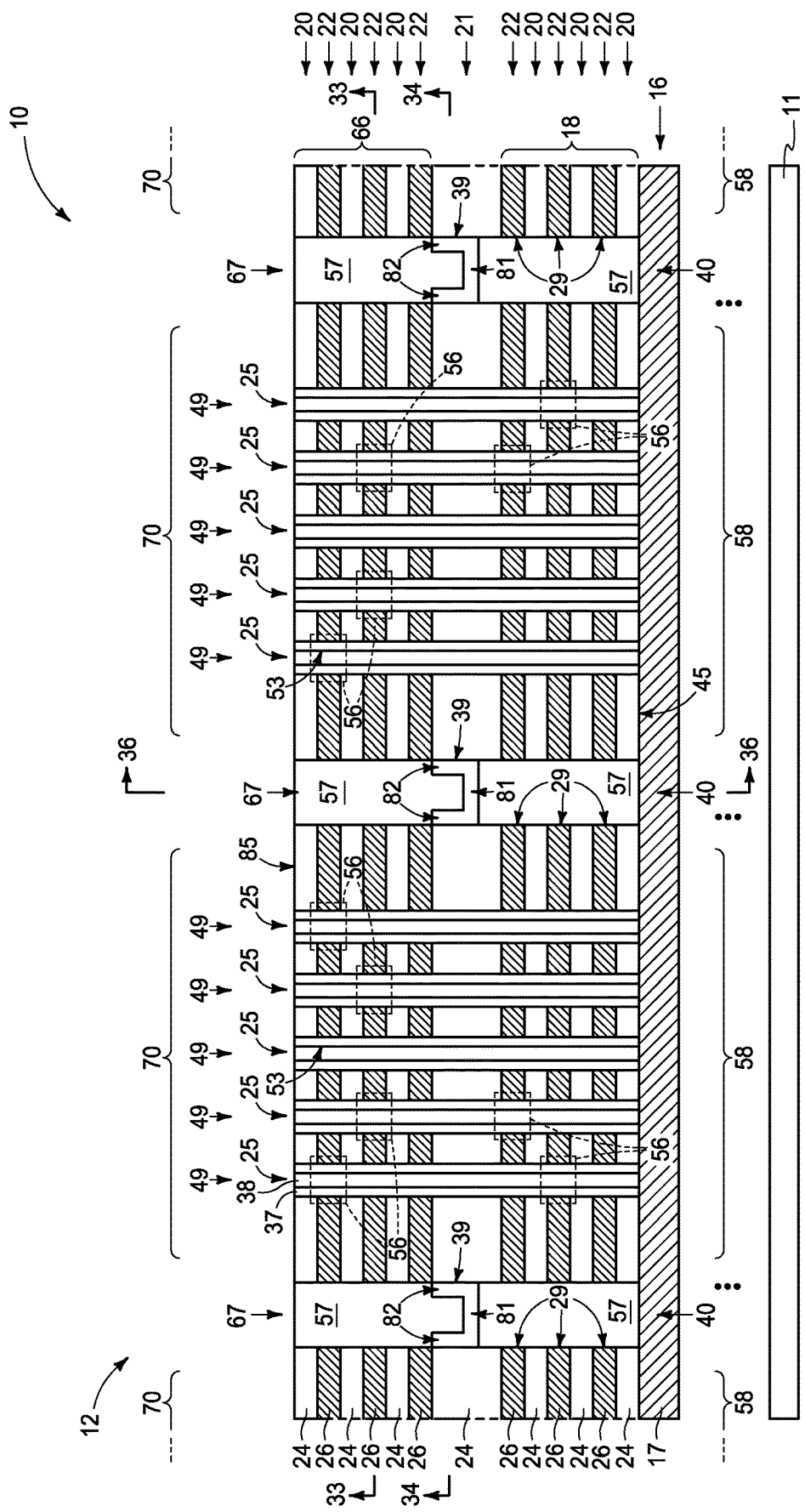
Figure 36:
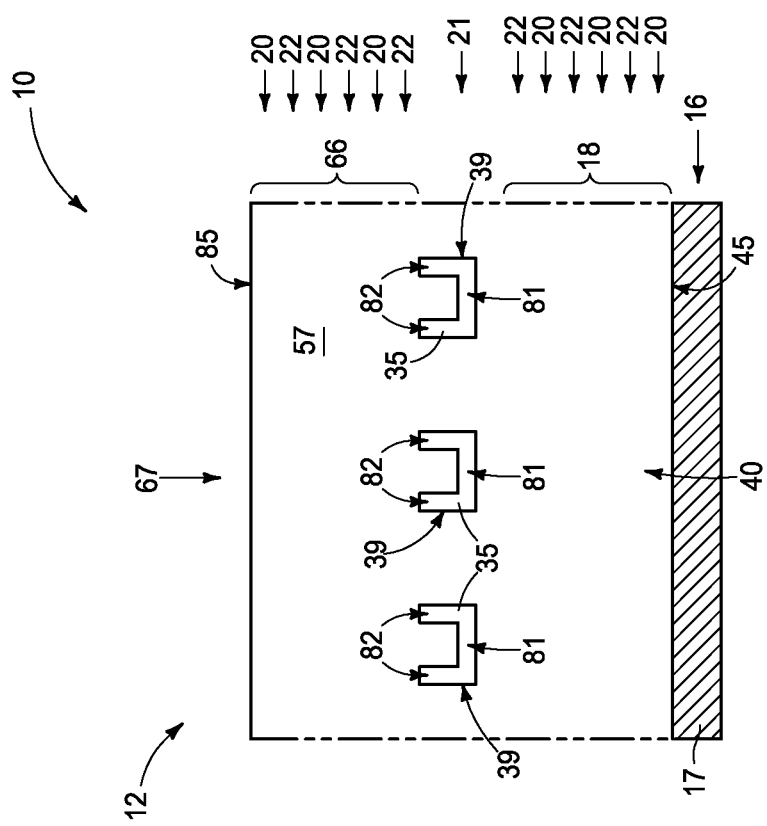

Embodiments of the invention include a memory array (e.g., 12) comprising strings (e.g., 49) of memory cells (e.g., 56). The memory array comprises laterally-spaced memory blocks (e.g., 70 and/or 58) individually comprising a vertical stack (e.g., 18 and/or 66) comprising alternating insulative tiers (e.g., 20) and conductive tiers (e.g., 22). Channel-material strings (e.g., 53) of the memory cells extend through the insulative tiers and the conductive tiers. Bridges (e.g., 39) extend laterally-between and are longitudinally-spaced-along immediately-laterally-adjacent memory blocks. The bridges are spaced above a bottom (e.g., 45) of the stack (i.e., spaced above the bottom of the lower of the lowest insulative and conductive tier). The bridges in a vertical cross-section (e.g., that of either of FIG. 35 or 36) have a base (e.g., 81) and at least two spaced walls, (e.g., 82) that project upwardly from the base. Intervening material (e.g., 57) is laterally-between and longitudinally-along the immediately-laterally-adjacent memory blocks, with the intervening material being directly under the bridges. In one such embodiment, the bridges are spaced below a top (e.g., 85) of the stack (i.e., spaced below the top of the upper of the uppermost insulative and conductive tier). In one embodiment, the memory array comprises only two of such spaced walls in the vertical cross-section. In one embodiment, the array comprises another vertical cross-section orthogonal to the first-stated vertical cross-section (e.g., the cross-section of one of FIG. 34 or 35 compared to the other of FIG. 34 or 35). Another at least two spaced walls (e.g., 82) are in the another vertical cross-section. In one embodiment, the intervening material is directly above the bridges and in one such embodiment is laterally-between the at least two spaced walls. In one embodiment, the vertical stack comprises an upper stack (e.g., 66) and a lower stack (e.g., 18), with an insulator tier (e.g., 21) being vertically between the upper and lower stacks. In one such embodiment, the bridges are in the insulator tier and in one such embodiment none of the bridges extends into the upper stack or the lower stack. Any other attribute(s) or aspect(s) as shown and/or described herein with respect to other embodiments may be used.

Embodiments of the invention include a memory array (e.g., 12) comprising strings (e.g., 49) of memory cells (e.g., 56). The memory array comprises laterally-spaced memory blocks (e.g., 70 and/or 58) individually comprising a vertical stack (e.g., 18 and/or 66) comprising alternating insulative tiers (e.g., 20) and conductive tiers (e.g., 22). Channel-material strings (e.g., 53) of the memory cells extend through the insulative tiers and the conductive tiers. Bridges (e.g., 39) extend laterally-between and are longitudinally-spaced-along immediately-laterally-adjacent memory blocks. The bridges have an upwardly-open cup-like shape. Intervening material (e.g., 57) is laterally-between and longitudinally-along the immediately-laterally-adjacent memory blocks. The intervening material is in the upwardly-open cup-like shape of the bridges. In one embodiment, the bridges are spaced above a bottom (e.g., 45) of the stack and in one such embodiment the intervening material is directly under the bridges. Any other attribute(s) or aspect(s) as shown and/or described herein with respect to other embodiments may be used.

The above processing(s) or construction(s) may be considered as being relative to an array of components formed as or within two stacks or two decks of such components above or as part of an underlying base substrate (albeit, the two stacks/decks may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time. Alternately, the processing(s) or construction(s) may be with respect to a single stack or single deck above or part of an underlying base substrate.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers. The stack comprises laterally-spaced memory-block regions that have horizontally-elongated trenches there-between. Sacrificial material is formed in the trenches. Vertical recesses are formed in the sacrificial material. The vertical recesses extend across the trenches laterally-between and are longitudinally-spaced-along immediately-laterally-adjacent of the memory-block regions. Bridge material is formed in the vertical recesses to line and less-than-fill the vertical recesses and form bridges there-from that have an upwardly-open cup-like shape. The sacrificial material in the trenches is replaced with intervening material that is directly under the bridges.

In some embodiments, a method used in forming a memory array comprising strings of memory cells comprises forming a lower stack comprising vertically-alternating lower first tiers and lower second tiers. An insulator tier is directly above the lower stack. The insulator tier and the lower stack comprise laterally-spaced lower memory-block regions that have horizontally-elongated lower trenches there-between. Sacrificial material is in the lower trenches in the insulator tier and in the lower stack. Vertical recesses are formed in the sacrificial material. The vertical recesses extend across the lower trenches laterally-between and are longitudinally-spaced-along immediately-laterally-adjacent of the lower memory-block regions. Bridge material is formed in the vertical recesses to line and less-than-fill the vertical recesses and form bridges there-from that have an upwardly-open cup-like shape. Etch-stop material is formed in the upwardly-open cup-like shape of the bridges. An upper stack comprising vertically-alternating upper first tiers and upper second tiers is formed directly above the bridges and the etch-stop material. Horizontally-elongated upper trenches are etched into the upper stack directly above the lower trenches to the etch-stop material in the upwardly-open cup-like shape of the bridges to form laterally-spaced upper memory-block regions that are directly above the lower memory-block-regions. The sacrificial material in the lower trenches is replaced with intervening material in the lower stack that is directly under the bridges. The intervening material is formed in the upper stack directly above the bridges.

In some embodiments, a method used in forming a memory array comprising strings of memory cells comprises forming a stack comprising vertically-alternating first tiers and second tiers and simultaneously forms (a) and (b), where (a): horizontally-elongated trenches into the stack to form laterally-spaced memory-block regions, and (b): channel openings into the stack laterally-between the horizontally-elongated trenches. Channel-material strings are formed in the channel openings. Intervening material is formed laterally-between and longitudinally-along the immediately-laterally-adjacent memory-block regions.

In some embodiments, a method used in forming a memory array comprising strings of memory cells comprises forming a stack comprising vertically-alternating first tiers and second tiers. One and only one masking step is used to collectively form (a) and (b) where, (a): horizontally-elongated trenches into the stack to form laterally-spaced memory-block regions, and (b): channel openings into the stack laterally-between the horizontally-elongated trenches. Channel-material strings are formed in the channel openings. Intervening material is formed laterally-between and longitudinally-along the immediately-laterally-adjacent memory-block regions.

In some embodiments, a memory array comprising strings of memory cells comprises laterally-spaced memory blocks that individually comprise a vertical stack comprising alternating insulative tiers and conductive tiers. Channel-material strings of memory cells extend through the insulative tiers and the conductive tiers. Bridges extend laterally-between and are longitudinally-spaced-along immediately-laterally-adjacent of the memory blocks. The bridges are spaced above a bottom of the stack. The bridges in a vertical cross-section have a base and at least two spaced walls that project upwardly from the base. Intervening material is laterally-between and longitudinally-along the immediately-laterally-adjacent memory blocks. The intervening material is directly under the bridges.

In some embodiments, a memory array comprising strings of memory cells comprises laterally-spaced memory blocks that individually comprise a vertical stack comprising alternating insulative tiers and conductive tiers. Channel-material strings of memory cells extend through the insulative tiers and the conductive tiers. Bridges extend laterally-between and are longitudinally-spaced-along immediately-laterally-adjacent of the memory blocks. The bridges have an upwardly-open cup-like shape. Intervening material is laterally-between and longitudinally-along the immediately-laterally-adjacent memory blocks. The intervening material is in the upwardly-open cup-like shape of the bridges.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a stack comprising vertically-alternating first tiers and second tiers, the stack comprising laterally-spaced memory-block regions having horizontally-elongated trenches there-between, sacrificial material being in the trenches;
    forming vertical recesses in the sacrificial material, the vertical recesses extending across the trenches laterally-between and longitudinally-spaced-along immediately-laterally-adjacent of the memory-block regions;
    forming bridge material in the vertical recesses to line and less-than-fill the vertical recesses and forming there-from bridges that have an upwardly-open cup-like shape; and
    replacing the sacrificial material in the trenches with intervening material that is directly under the bridges.

2. The method of claim 1 comprising forming channel openings into the stack laterally-between the trenches, forming the sacrificial material in the channel openings.

3. The method of claim 2 wherein the replacing comprises removing the sacrificial material from the trenches, and further comprising removing the sacrificial material from the channel openings before removing the sacrificial material from the trenches.

4. The method of claim 2 comprising simultaneously forming the trenches and the channel openings.

5. The method of claim 2 comprising using one and only one masking step to collectively form the trenches and the channel openings.

6. The method of claim 1 comprising forming the intervening material directly above the bridges.

7. The method of claim 6 comprising forming the intervening material in the upwardly-open cup-like shape of the bridges.

8. The method of claim 1 wherein the bridge material is insulative.

9. The method of claim 1 wherein the bridge material is at least one of semiconductive or conductive.

10. A method used in forming a memory array comprising strings of memory cells, comprising:
forming a lower stack comprising vertically-alternating lower first tiers and lower second tiers, an insulator tier being directly above the lower stack, the insulator tier and the lower stack comprising laterally-spaced lower memory-block regions having horizontally-elongated lower trenches there-between, sacrificial material being in the lower trenches in the insulator tier and in the lower stack;
forming vertical recesses in the sacrificial material, the vertical recesses extending across the lower trenches laterally-between and longitudinally-spaced-along immediately-laterally-adjacent of the lower memory-block regions;
forming bridge material in the vertical recesses to line and less-than-fill the vertical recesses and forming there-from bridges that have an upwardly-open cup-like shape;
forming etch-stop material in the upwardly-open cup-like shape of the bridges;
forming an upper stack comprising vertically-alternating upper first tiers and upper second tiers directly above the bridges and the etch-stop material;
etching horizontally-elongated upper trenches into the upper stack directly above the lower trenches to the etch-stop material in the upwardly-open cup-like shape of the bridges to form laterally-spaced upper memory-block regions that are directly above the lower memory block-regions; and
replacing the sacrificial material in the lower trenches with intervening material in the lower stack that is directly under the bridges, and forming the intervening material in the upper stack directly above the bridges.

11. The method of claim 10 comprising etching away all remaining of the etch-stop material after forming the upper trenches.

12. The method of claim 11 wherein the replacing comprises etching the sacrificial material from the lower trenches at the same time as the etching away all remaining of the etch-stop material.

13. The method of claim 11 wherein the etch-stop material and the sacrificial material are of the same composition relative one another.

14. The method of claim 11 wherein the etch-stop material and the sacrificial material are of different compositions relative one another.

15. A method used in forming a memory array comprising strings of memory cells, comprising:
forming a stack comprising vertically-alternating first tiers and second tiers;
simultaneously forming (a) and (b), where,
(a): horizontally-elongated trenches into the stack to form laterally-spaced memory-block regions; and
(b): channel openings into the stack laterally-between the horizontally-elongated trenches;
forming channel-material strings in the channel openings; and
forming intervening material laterally-between and longitudinally-along the immediately-laterally-adjacent memory-block regions.

16. The method of claim 15 comprising forming bridges in the trenches that have an upwardly-open cup-like shape.

17. The method of claim 15 comprising forming bridges in the trenches that have an upwardly-open cup-like shape.

18. A method used in forming a memory array comprising strings of memory cells, comprising:
forming a stack comprising vertically-alternating first tiers and second tiers;
using one and only one masking step to collectively form (a) and (b), where,
(a): horizontally-elongated trenches into the stack to form laterally-spaced memory-block regions; and
(b): channel openings into the stack laterally-between the horizontally-elongated trenches;
forming channel-material strings in the channel openings; and
forming intervening material laterally-between and longitudinally-along the immediately-laterally-adjacent memory-block regions.

19. A memory array comprising strings of memory cells, comprising:
laterally-spaced memory blocks individually comprising a vertical stack comprising alternating insulative tiers and conductive tiers, channel-material strings of memory cells extending through the insulative tiers and the conductive tiers;
bridges extending laterally-between and longitudinally-spaced-along immediately-laterally-adjacent of the memory blocks, the bridges being spaced above a bottom of the stack, the bridges in a vertical cross-section having a base and at least two spaced walls that project upwardly from the base; and
intervening material laterally-between and longitudinally-along the immediately-laterally-adjacent memory blocks, the intervening material being directly under the bridges.

20. The memory array of claim 19 wherein the bridges are insulative.

21. The memory array of claim 19 wherein the bridges are semiconductive.

22. The memory array of claim 19 wherein the bridges are conductive.

23. The memory array of claim 19 wherein the bridges are spaced below a top of the stack.

24. The memory array of claim 19 comprising only two of said spaced walls in the vertical cross-section.

25. The memory array of claim 19 comprising another vertical cross-section orthogonal to the first-stated vertical cross-section, another at least two spaced walls in the another vertical cross-section.

26. The memory array of claim 19 wherein the intervening material is directly above the bridges.

27. The memory array of claim 19 wherein the vertical stack comprises an upper stack and a lower stack, an insulator tier being vertically between the upper and lower stacks, the bridges being in the insulator tier.

28. The memory array of claim 27 wherein none of the bridges extends into the upper stack or the lower stack.

29. The memory array of claim 27 wherein the insulator tier is thicker than each of the alternating insulative tiers and conductive tiers in the upper and lower stacks.

30. The memory array of claim 19 comprising NAND.

31. A memory array comprising strings of memory cells, comprising:
laterally-spaced memory blocks individually comprising a vertical stack comprising alternating insulative tiers and conductive tiers, channel-material strings of memory cells extending through the insulative tiers and the conductive tiers;
bridges extending laterally-between and longitudinally-spaced-along immediately-laterally-adjacent of the memory blocks, the bridges having an upwardly-open cup-like shape; and intervening material laterally-between and longitudinally-along the immediately-laterally-adjacent memory blocks, the intervening material being in the upwardly-open cup-like shape of the bridges.

32. The memory array of claim 31 wherein the bridges are spaced above a bottom of the stack.

33. The memory array of claim 32 wherein the intervening material is directly under the bridges.

\* \* \* \* \*